(12) United States Patent
Jiang et al.

(10) Patent No.: US 9,093,581 B2
(45) Date of Patent: Jul. 28, 2015

(54) STRUCTURES AND DEVICES BASED ON BORON NITRIDE AND BORON NITRIDE-III-NITRIDE HETEROSTRUCTURES

(75) Inventors: Hongxing Jiang, Lubbock, TX (US); Sashikanth Majety, Lubbock, TX (US); Rajendra Dahal, Lubbock, TX (US); Jing Li, Lubbock, TX (US); Jingyu Lin, Lubbock, TX (US)

(73) Assignee: Texas Tech University System, Lubbock, TX (US)

( * ) Notice: Subject to any disclaimer, the term of this patent is extended or adjusted under 35 U.S.C. 154(b) by 0 days.

(21) Appl. No.: 13/482,030

(22) Filed: May 29, 2012

(65) Prior Publication Data

US 2013/0292687 A1     Nov. 7, 2013

Related U.S. Application Data

(63) Continuation-in-part of application No. 13/464,977, filed on May 5, 2012.

(51) Int. Cl.
| | |
|---|---|
| *H01L 33/06* | (2010.01) |
| *H01L 33/32* | (2010.01) |
| *H01L 29/778* | (2006.01) |
| *H01L 29/16* | (2006.01) |
| *H01L 33/04* | (2010.01) |
| *H01L 31/0304* | (2006.01) |
| *H01L 31/0352* | (2006.01) |
| *H01L 31/105* | (2006.01) |
| *H01L 31/108* | (2006.01) |

(Continued)

(52) U.S. Cl.
CPC .......... *H01L 31/03048* (2013.01); *B82Y 20/00* (2013.01); *H01L 31/035236* (2013.01); *H01L 31/105* (2013.01); *H01L 31/1085* (2013.01); *H01L 31/1848* (2013.01); *H01L 31/1852* (2013.01); *H01L 33/32* (2013.01); *H01L 33/06* (2013.01); *Y02E 10/544* (2013.01)

(58) Field of Classification Search
USPC .................. 257/70, 43, E31.021; 438/382, 93
See application file for complete search history.

(56) References Cited

U.S. PATENT DOCUMENTS

| | | | |
|---|---|---|---|
| 7,372,009 B1* | 5/2008 | Losee et al. ................... | 250/200 |
| 2007/0228408 A1* | 10/2007 | Asano .......................... | 257/103 |
| 2010/0032647 A1 | 2/2010 | Khan | |

(Continued)

OTHER PUBLICATIONS

Carrano, John,"Ultraviolet Light," SPIE's OEMagazine, Jun. 2003, pp. 20-23.

(Continued)

*Primary Examiner* — Vongsavanh Sengdara
*Assistant Examiner* — Thai T Vuong
(74) *Attorney, Agent, or Firm* — Chainey P. Singleton; Edwin S. Flores; Chalker Flores, LLP

(57) ABSTRACT

The present invention relates to optoelectronic device layer structures, light emitting devices, and detectors based upon heterostructures formed between hexagonal boron nitride (hNB) and III nitrides, and more particularly, to heterojunction devices capable of emitting and detecting photons in the ultraviolet (UV) and extremely ultraviolet (RUV) spectral range. The present invention also relates to neutron detectors based on epitaxially grown hBN thin films (or epitaxial layers) and hBN stacked thin films (or epitaxial layers) to satisfy the thickness required for capturing all incoming neutrons.

14 Claims, 27 Drawing Sheets

(51) Int. Cl.
H01L 31/18 (2006.01)
B82Y 20/00 (2011.01)

(56) References Cited

U.S. PATENT DOCUMENTS

2010/0314605 A1* 12/2010 Khan ............................. 257/13
2011/0175101 A1* 7/2011 Hatano et al. .................. 257/72
2011/0256386 A1* 10/2011 Shi et al. ....................... 428/336

OTHER PUBLICATIONS

Conway, A., et al., "Numerical Simulations of Pillar Structured Sold State Thermal Neutron Detector Efficiency and Gamma Discrimination," Transactions on Nuclear Science, Jun. 30, 2008, 11 pages.

Fan, Z.Y., et al., "Achieving Conductive High Al-Content AlGaN Alloys for Deep UV Photonics," Proc. of SPIE, vol. 6479, (2007), 11 pages.

Fujioka, Akira,e t al., "Improvement in Output Power of 280-nm Deep Ultraviolet Light-Emitting Diode by Using AlGaN Multi Quantum Wells," Applied Physics Express (2010), 3 pages.

Gersch, H.K., et al., "The Effect of Incremental Gamma-Ray Doses and Incremental Neutron FLuences Upon the Performance of Self-Biased B-Coated High-Purity Epitaxial GaAs Thermal Neutron Detectors," Nuclear Instruments and Methods in Physics Research, (2002), 489:85-98.

He, B., et al., "P-Type Conduction in Beryllium-Implanted Hexagonal Boron Nitride Films," Applied Physics Letters, (2009), 4 pages.

Hirayama, Hideki, et al., "Marked Enhancement in the Efficiency of Deep-Ultraviolet AlGaN Light-Emitting Diodes by Using a Multiquantum-Barrier Electron Blocking Layer," Applied Physics Express, (2010), 3 pages.

Khizar, M., et al., "Nitride Deep-Ultraviolet Light-Emitting Diodes with Microlens Array," Applied Physics Letters, (2005), vol. 85, 3 pages.

Knoll, G. F., "Radiation Detection and Measurement," 3rd ed (J. Wiley, 2000); N. Tsoulfanidis, Measurement and Detection of Radiation, pp. 131-137.

Kouzes, RT., "The 3HE Supply Problem," U.S. Department of Energy, PNNL-18388, Jun. 20, 2009, 15 pages.

Kurtz, Sarah., et al., "Multifunction Solar Cells for Conversion of Concentrated Sunlight to Electricity," Optics Express, Apr. 26, 2010, 6 pages.

Licausi, Nicolas, et al., "A Novel Solid-State Self Powered Neutron Detector," Proc. of SPIE, vol. 7079, (2008), pp. 12 pages.

Lu, Ming, et al., "Electrical Properties of Boron Nitride Thin Films Grown by Neutralized Nitrogen Ion Assisted Vapor Deposition," Appl. Phys. Lett., Jan. 29, 1996, vol. 68, 3 pages.

Mirkarimi, P.B. et al., "Review of Advances in Cubic BoronNitride Film Synthesis," Materials Science and Engineering, (1997), pp. 47-100.

Nakarmi, M.L., et al., Transport Properties of Highly Conductive N-Type Al-Rich AlxGa1—xN (x>0.7), Applied Physics Letters, Oct. 25, 2004, vol. 85, No. 17, pp. 3769-3771.

Nakarmi, M.L., et al., Electrical and Optical properties of Mg-Doped Al6.7 Ga0.3 N Alloys, Applies Physics Letters, (2005), vol. 86, 3 pps.

Nakarmi, M.L., Correlation Between Optical and Electrical Properties of Mg-Doped AlN Epilayers, Applied Physics Letters, (2006), vol. 80, 3 pages.

Nam, K.B., et al., "Mg Acceptor Level in AlN Probed by Deep Ultraviolet Photoluminescence," Applied Physics Letters, Aug. 4, 2003, vol. 83, No. 5, pp. 878-880.

Nepal, N., et al., "Growth and Photoluminescence Studies of Zn-Doped AlN Epilayers," Applied Physics Letters, (2006), vol. 89, 4 pages.

Nikolic, R.J., et al., "Roadmap for High Efficiency Solid-State Neutron Detectors," Proceedings of SPIE, Oct. 25, 2005, vol. 6013, 11 pages.

Nikolic, R.J., et al., Future of Semiconductor Based Thermal Neutron Detectors, Nanotech 2006, May 7-11, 2006, 7 pages.

Nikolic, R.J., et al., "6:1 Aspect Ratio Silicon Pillar Based Thermal Neutron Detector Filled with 10B," Applied Physics Letters, (2008), 93, 4 pages.

Nose, K., et al., "Electric Conductivity of Boron Nitride Thin Films Enhances bu in situ Doping of Zinc," Applied Physics Letters, (2006), 89, 4 pages.

Osberghaus, O., Die Isotopenhaufigkeit des Bors. Massenspektrometrische Untersuchung der Elektronenstobprodukte von BFs and BCI3, Zeitschrift fur Physik, (1950), pp. 366-377.

Pemot, Cyril, et al., "Improved Efficiency of 255-280 mm AlGaN-Based Light-Emitting Diodes," Applied Physics Express, (2010), vol. 3, 3 pages.

Shatalov, Max, et al., "Large Chip High Power Deep Ultraviolet Light-Emitting Diodes," Applied Physics Express, (2010), 3, 3 pages.

Uher, J., et al., "Efficiency of Composite Boron Nitride Neutron Detectors in Comparison with Helium-3 Detectors," (2007), Applied Physics Letters, 90, 3 pages.

Watanabe, Kenji, et al., "Direct-Bandgap Properties and Evidence for Ultraviolet Lasing of Hexagonal Boron Nitride Single Crystal," Nature Materials, Jun. 2004, vol. 3, pp. 404-409.

Zhu, K., et al., "Silicon Doping Dependence of Highly Conductive n-Type Al 0.7GA0.3N," Applies Physics Letters, Nov. 15, 2004, vol. 85, No. 20, pp. 4669-4671.

* cited by examiner

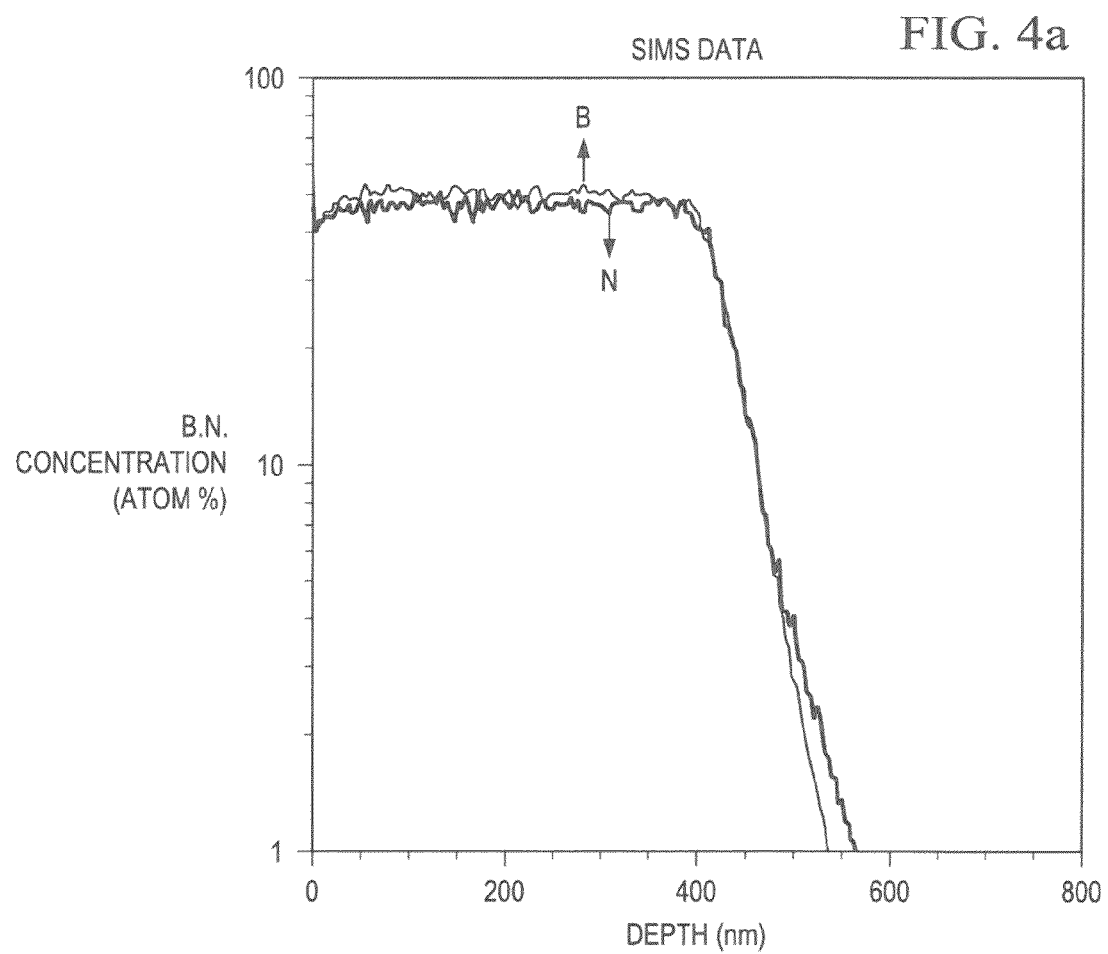

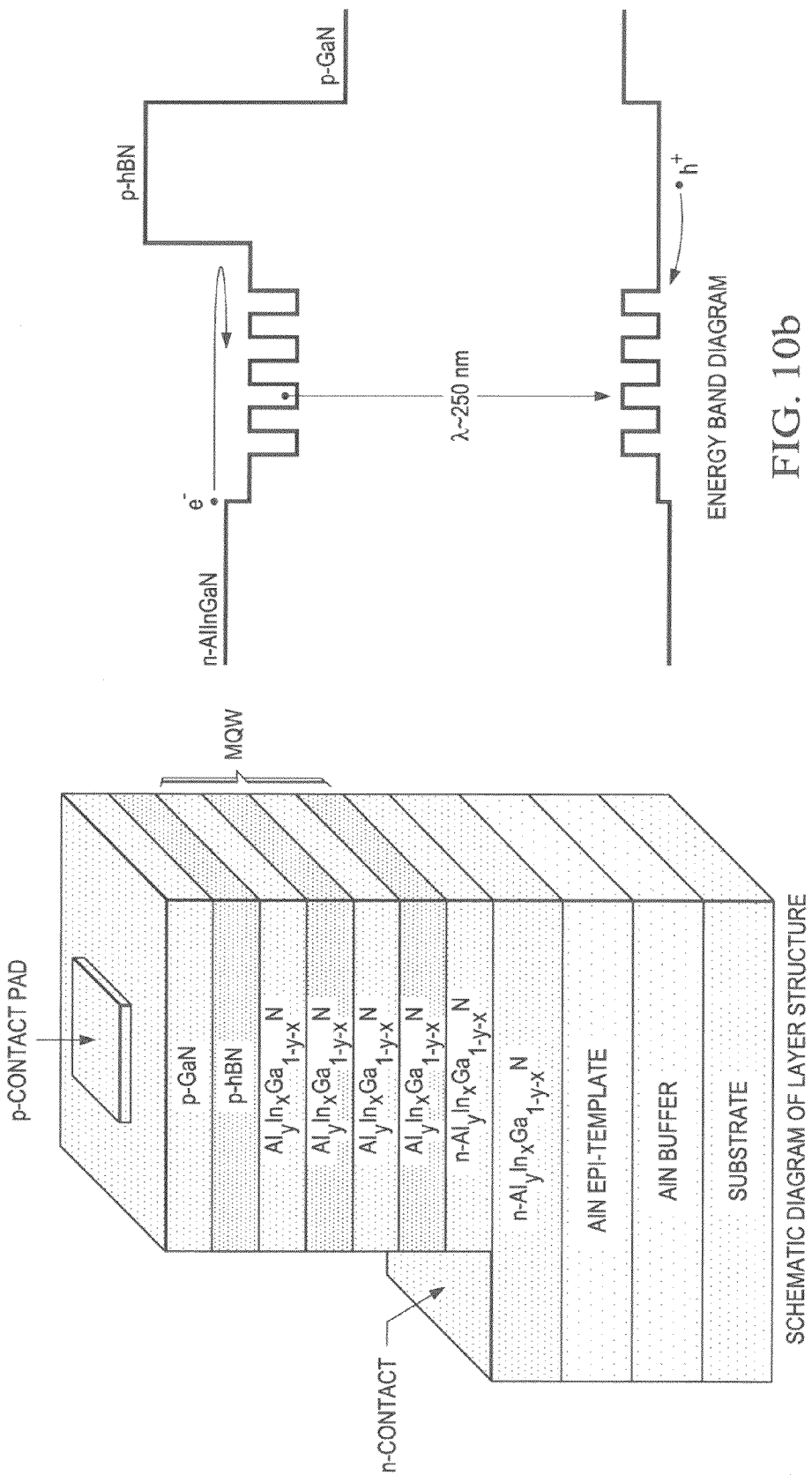

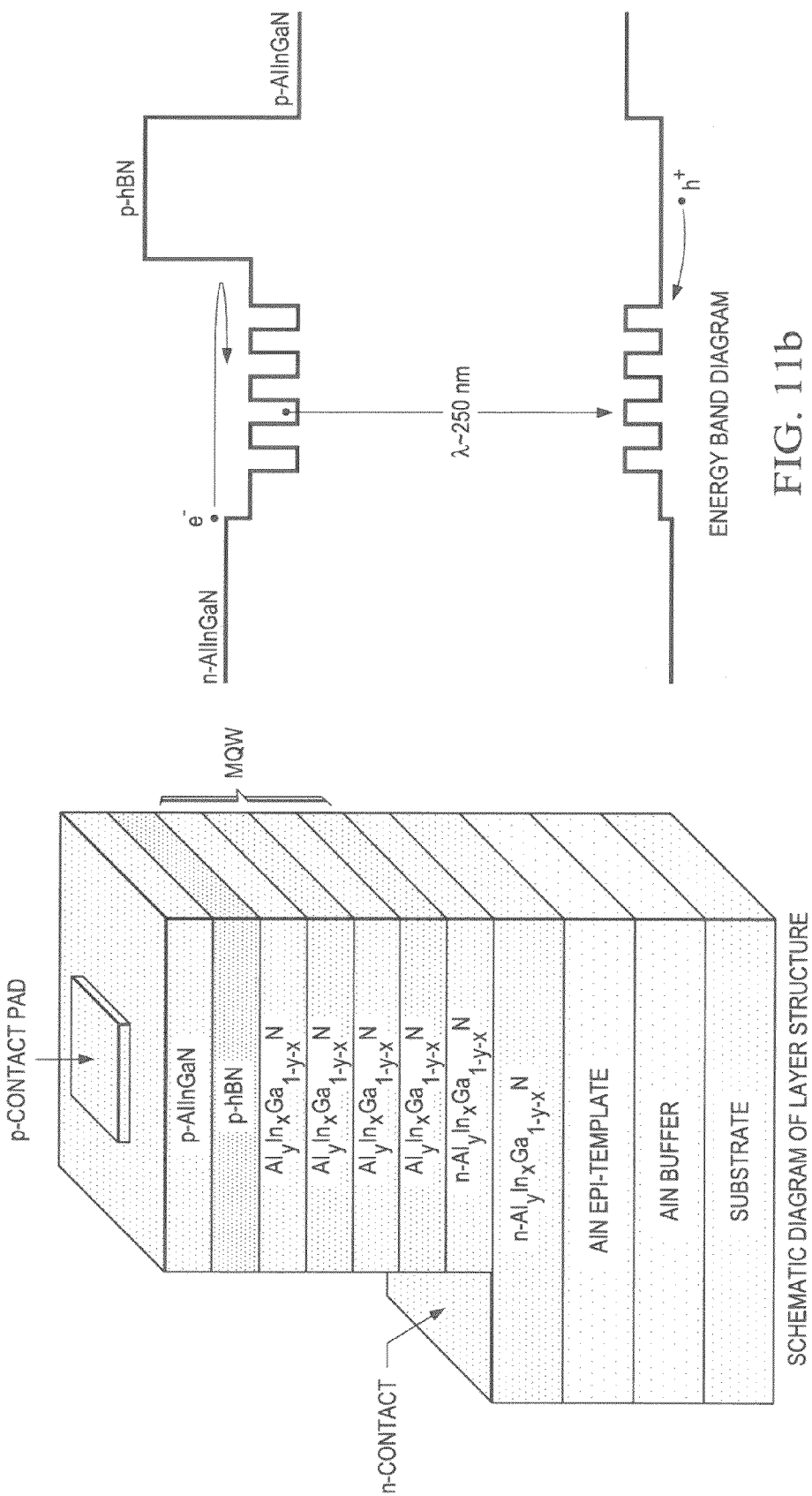

STRUCTURES AND DEVICES BASED ON BORON NITRIDE AND BORON NITRIDE-III-NITRIDE HETEROSTRUCTURES

CROSS-REFERENCE TO RELATED APPLICATIONS

This patent application is a continuation-in-part application of U.S. patent application Ser. No. 13/464,977 filed on May 5, 2012 and entitled "Structures and Devices Based on Boron Nitride and Boron Nitride-III-Nitride Heterostructures."

TECHNICAL FIELD OF THE INVENTION

The present invention relates in general to optoelectronic devices, and specifically to methods of making and using layer structures, light emitting devices, and detectors based upon heterostructures formed between hexagonal boron nitride (hNB) and III-nitrides.

STATEMENT OF FEDERALLY FUNDED RESEARCH

None.

INCORPORATION-BY-REFERENCE OF MATERIALS FILED ON COMPACT DISC

None.

BACKGROUND OF THE INVENTION

There is a great need for the development of chip-scale deep UV (<300 nm) light sources and detectors for a wide range of civilian and defense applications. The applications of present deep UV (DUV) systems are limited by the cost, size, weight, power requirements, and performance of the system. The realization of chip-scale DUV emitters would provide significant benefits in terms of cost and volume, as well as allow for integration with other functional photonic devices. The realization of high performance ultraviolet devices in general will significantly improve the size, weight, power, and capability of chemical/biological-agent detectors, portable water purification illuminators, and numerous other UV-dependent applications with respect to existing systems.

SUMMARY OF THE INVENTION

The present invention relates to optoelectronic device layer structures, light emitting devices, and detectors based upon heterostructures formed between hexagonal boron nitride (hNB) and III-nitrides, and more particularly, to heterojunction devices capable of emitting and detecting photons in the ultraviolet (UV) and extremely ultraviolet (EUV) spectral range. The present invention also relates to neutron detectors based on epitaxially grown hBN thin films (or epitaxial layers) and hBN stacked thin films (or epitaxial layers) to satisfy the thickness required for capturing all incoming neutrons.

With existing semiconductor detector technology developed in the last 50 years, hBN based semiconductor neutron detectors have the potential to revolutionize neutron detection and dramatically enhance the capability for nuclear weapon detection. The devices, as contemplated by the present invention, possess the unique advantages of high efficiency (approaching 100%) with each captured neutron contributing to electrical signal generation. Additionally, the technology is all solid-state, small, lightweight, portable, and low voltage operation, with the capability for high resolution (~10 μm) imaging detectors or 2D array neutron cameras, which are important for many applications such as determining the size and shape of nuclear devices.

The present invention provides a hexagonal boron nitride semiconductor detector comprising: a substrate; and one or more hexagonal boron nitride epilayers coated on the substrate. The substrate may be sapphire, SiC, Si, Graphite, highly oriented pristine graphite (HOPG), GaN, AlN, BN, or a combination thereof. The one or more hexagonal boron nitride epilayers may be $B_{1-x}Ga_xN$ alloys; $B_{1-x}Al_xN$, $B_{1-x-y}Al_xGa_xN$, and $B_{1-x-y}N_xC_y$ alloys. The one or more hexagonal boron nitride epilayers may be enriched $^{10}B$. The device may include alternating AlN and hexagonal boron nitride (hBN) layers or alternating hBN and boron carbon (BCN) layers or more generally alternating InAlGaN and BCN layers. The hexagonal boron nitride semiconductor may be a heterostructure selected from $BN/B_{1-x}Ga_xN$ heterostructures; $BN/B_{1-x}Al_xN$ heterostructures; $BN/B_{1-x-y}Al_xGa_yN$ heterostructures; $InAlGaN/(BN)_{1-x}C_x$ heterostructures; or $BN/B1_{-x-y}N_xC_y$ heterostructures. The one or more hexagonal boron nitride epilayers may be individually doped with one or more p-type dopants selected from Si, Mg, C, Zn, Be; one or more n-type dopants selected from Si, O, S, Se; or both. The one or more quantum wells may be selected from $BN/B_{1-x}Ga_xN/BN$, $B_{1-y}Ga_yN/B_{1-x}Ga_xN/B_{1-z}Ga_zN$ QWs; $BN/B_{1-x}Al_xN/BN$, $B_{1-y}Al_yN/B_{1-x}Al_xN/B_{1-z}Al_zN$ QWs; $BN/B_{1-x-y}A_{1x}Ga_yN/BN$ QWs; $BN/(BN)_{1-x}C_x/BN$ QWs; $BN/B_{1-x-y}N_xC_y/BN$ QWs and $InAlGaN/(BN)_{1-x}C_x/InAlGaN$ QWs. The device may include a buffer layer between the substrate and the one or more hexagonal boron nitride epilayers; between two of the one or more hexagonal boron nitride epilayers or both. The device may include one or more buffer layers selected from a BN buffer, a AlN buffer, a GaN buffer, a AlGaN buffer, a BAlN buffer, a BGaN buffer, a BCN buffer, a BAlGaN buffer or a combination thereof. The device may include one or more contacts comprising Au, Al, Ni, Pd, Pt, and alloys thereof. The hexagonal boron nitride semiconductor device may be a Neutron detector, a Metal-semiconductor-metal detector, a Schottky detector, a p-i-n detector, a lateral conducting detector, a stacked layer detector. The hexagonal boron nitride semiconductor device may be a UV emitter or detector comprising a BN p-i-n structure, an n-BN/(BN)C/p-BN emitter or detector, an n-(BN)C/(BN)C/p-(BN)C emitter or detector, an n-BN/AlBN/p-BN emitter or detector, an n-BN/GaBN/p-BN emitter or detector, an n-InGaAlN/(BN)C/p-InGaAlN emitter or detector, an n-(BN)C/InAlGaN/p-(BN)C emitter or detector, or an n-BN/AlGaBN/p-BN emitter or detector.

The present invention provides a hexagonal boron nitride semiconductor detector comprising: a substrate comprising sapphire, SiC, Si, Graphite, highly oriented pristine graphite (HOPG), GaN, AlN, BN, or a combination thereof; an buffer layer deposited on the substrate; one or more AlGaBN or BCN layers coated on the substrate, wherein the AlGaBN or BCN layer has a n-contact region and a p-contact region; a n-contact in communication with the n-contact region; an active region, and a p-contact region connected to the one or more AlGaBN layers or BCN layers, a p-hexagonal boron nitride epilayer connected to the active region; and a p-contact in communication with the p-hexagonal boron nitride epilayer.

The present invention provides a method of forming a hexagonal boron nitride semiconductor device by providing a substrate; providing a source of B and N; depositing the B and N on the substrate to form one or more hexagonal boron nitride epilayers on the substrate. The one or more hexagonal boron nitride epilayers coated on the substrate may be deposited by MOCVD or HVPE growth. The method may include depositing a buffer layer on the substrate between the substrate and the one or more hexagonal boron nitride epilayers. This may include adding one or more dopants to the one or more hexagonal boron nitride epilayers, selected from one or more p-type dopants selected from Si, Mg, C, Zn, Be and one or more n-type dopants selected from Si, O, S, and Se. The method may include the step of removing the substrate layer. The hexagonal boron nitride semiconductor device may be a Neutron detector, a Metal-semiconductor-metal detector, a Schottky detector, a p-i-n detector, a Lateral conducting detector, a stacked layer detector. The hexagonal boron nitride semiconductor device is a light emitting or detecting device; may be an n-BN/(BN)C/p-BN emitter or detector, an n-(BN)C/(BN)C/p-(BN)C emitter or detector, an n-BN/AlBN/p-BN emitter or detector, an n-BN/GaBN/p-BN emitter or detector, an n-InGaAlN/(BN)C/p-InGaAlN emitter or detector, an n-(BC)C/InAlGaN/p-(BN)C emitter or detector, or an n-BN/AlGaBN/p-BN emitter or detector.

BRIEF DESCRIPTION OF THE DRAWINGS

For a more complete understanding of the features and advantages of the present invention, reference is now made to the detailed description of the invention along with the accompanying figures and in which:

FIGS. 4a-d are graphs characterizing the undoped h-BN epilayers grown by metal organic chemical vapor deposition.

FIG. 10a is a schematic of a DUV emitter layer structure including AlInGaN quaternary alloys and FIG. 10b is an energy band diagram.

FIG. 11a is a schematic of a DUV emitter layer structure including p-AlInGaN quaternary alloys and FIG. 11b is an energy band diagram.

DETAILED DESCRIPTION OF THE INVENTION

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

Figures 1A, 1B:
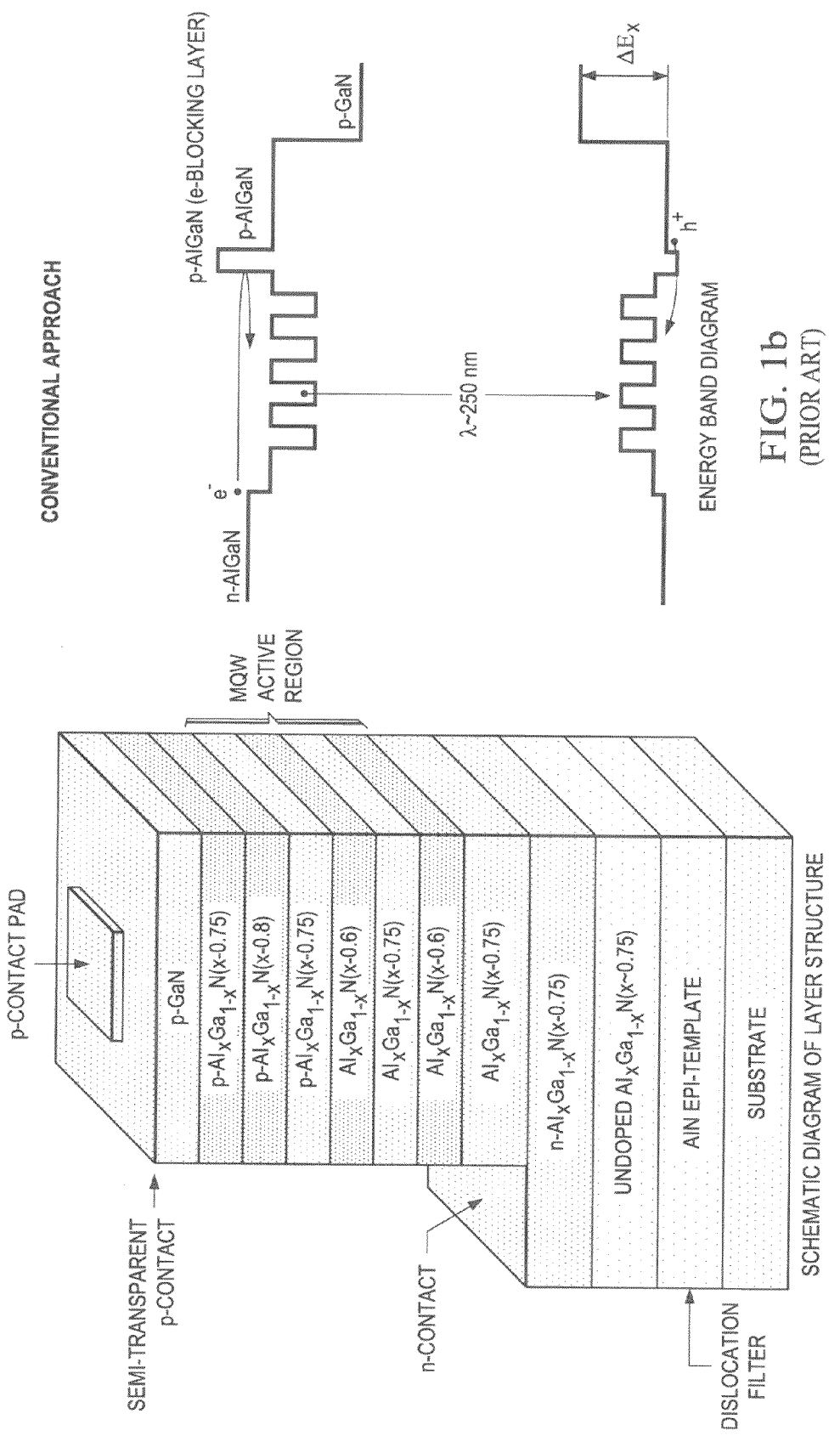
FIG. 1a is a schematic of a typical DUV emitter layer structure employing AlGaN.
FIG. 1b is an energy band diagram.

Among all semiconductors, III-nitride materials (AlInGaN material system), Al-rich AlGaN ternary alloys in particular, have been the default choice for the development of efficient light emitting diodes (LEDs) and chip-scale semiconductor laser diodes (LDs) operating at wavelengths below 300 nm. Al-rich AlGaN alloys with high n-type conductivities have been realized. Previous published results indicate that n-type conductivity control in Al-rich AlGaN alloys is not an issue for DUV devices. Various groups in the world have obtained DUV LEDs with emission wavelength below 280 nm with relatively low quantum efficiency (<3%) and short operating lifetime. FIG. 1a is a schematic of a typical DUV emitter layer structure employing AlGaN and FIG. 1b is an energy band diagram. In general, DUV emitter material structure is optimized based on the study of n- and p-AlGaN. A high-temperature grown AlN epitaxial layer (epi-template) is grown on a substrate (e.g., sapphire). This is then followed by the growth of an undoped Al-rich AlGaN layer and highly conductive Si-doped Al-rich n-AlGaN cladding layer, followed by quantum well (QW) active region consisting of alternating layers of AlGaN wells/AlGaN barriers and then Mg-doped AlGaN electron blocking layer. Since it is difficult to achieve a reasonable hole concentration in an AlGaN alloy with high Al composition, a Mg doped high Al-content AlGaN layer is generally employed as an electron blocking layer to block the electron overflow into the p-type layers, thereby enhancing the electron-hole radiative recombination in the QWs. The structure is then completed with a p-AlGaN cladding layer, and a highly doped p-GaN thin contact layer. Al mole fraction can be adjusted depending on the target emission wavelength. In general, the barrier layers in the QW active region have similar Al mole fractions as the n- and p-type cladding layers, while the well region has the lowest Al mole fraction (except the p-GaN contact layer) and the electron blocking layer has the highest Al mole fraction in the entire structure.

Figure 2A:
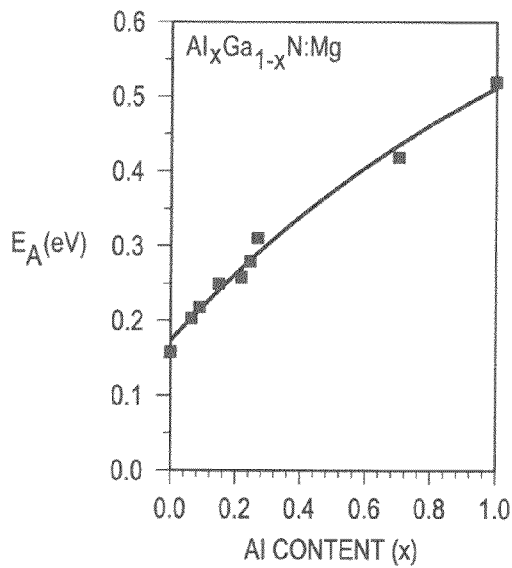
FIG. 2a is a plot of the activation energy, $E_A$, of Mg acceptor in $Al_xGa_{1-x}N$ alloys as a function of Al-content.
Figure 2B:
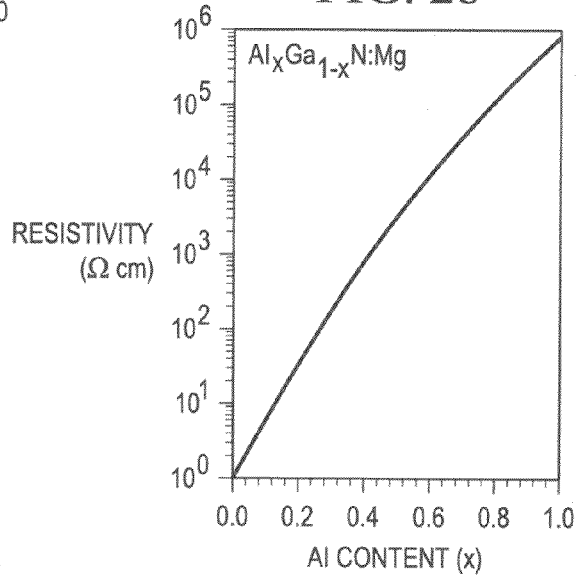
FIG. 2b is a graph of the P-type resistivity of $Al_xGa_{1-x}N$, ρAlGaN, as a function of Al-content.
Figure 2C:
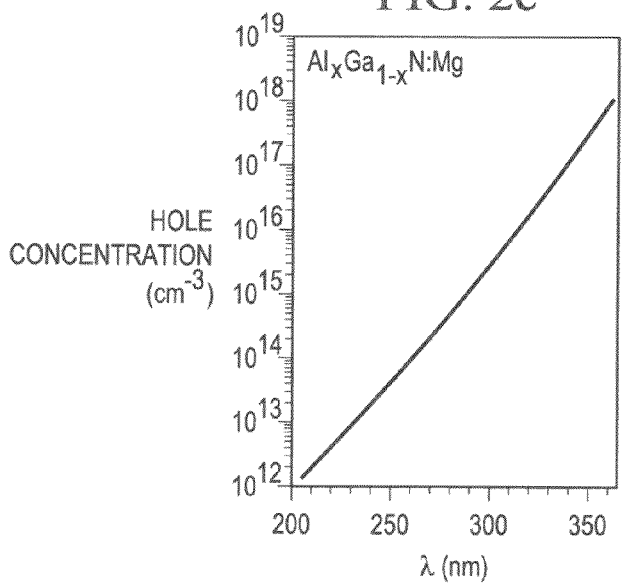
FIG. 2c is a graph of the estimated free hole concentration ($p_{AlGaN}$) in the p-$Al_xGa_{1-x}N$ electron blocking layer as a function of emission wavelength of $Al_xGa_{1-x}N$ DUV emitters.

The poor p-type conductivity in Al-rich $Al_xGa_{1-x}N$ alloys is currently the major obstacle that limits the quantum efficiency (QE) of DUV emitters based upon AlInGaN materials system. This problem is due to the deepening of the Mg acceptor energy level ($E_A$) in $Al_xGa_{1-x}N$ with increasing x, from about 170 meV (x=0, GaN) to 530 meV (x=1, AlN), as shown in FIG. 2a. FIG. 2a is a plot of the activation energy, $E_A$, of Mg acceptor in $Al_xGa_{1-x}N$ alloys as a function of Al-content. FIG. 2b is a graph of the P-type resistivity of $Al_xGa_{1-x}N$, $\rho(AlGaN)$, as a function of Al-content according to $\rho(AlGaN)=\rho_{GaN}\exp(\Delta E_A/kT)=\rho_{GaN}\exp\{[E_A(AlGaN)-E_A(GaN)]/kT\}$ at 300 K. In the plot, the typical p-type resistivity value of GaN, $\rho(GaN)=1$ Ωcm and $E_A$ values in FIG. 2(a) are used. FIG. 2c is a graph of the estimated free hole concentration ($\rho_{AlGaN}$) in the p-$Al_xGa_{1-x}N$ electron blocking layer as a function of emission wavelength of $Al_xGa_{1-x}N$ DUV emitters, according to $\rho_{AlGaN}=\rho_{GaN}\exp(-\Delta E_A/kT)=\rho_{GaN}\exp\{-[E_A(AlGaN)-E_A(GaN)]/kT\}$. In the plot, $E_g=xE_g(AlN)+(1-x)E_g(GaN)+bx(1-x)$, $E_g(AlN)=6.05$ eV, $E_g(GaN)=3.42$ eV, b=0.98 eV and typical free hole concentration in GaN, $\rho_{GaN}=1\times10^{18}$ cm$^3$ are used.

III-nitride DUV emitters must incorporate an electron-blocking (e-blocking) layer with a larger band gap than the active region to maximize electron- and hole radiative recombination in the QW active region. The Al-rich AlGaN e-blocking layer is the most resistive p-layer in the device structure. Unfortunately, this highly resistive e-blocking layer must have a certain thickness in order to stop unwanted long wavelength emission due to the recombination between electrons and Mg impurities in the p-type layers. Since the free hole concentration (p) decreases exponentially with an increase of the acceptor energy level, $p\sim\exp(-E_A/kT)$, an $E_A$ value around 500 meV in AlN translates to only 1 free hole for roughly every 2 billion ($2\times10^9$) incorporated Mg impurities at room temperature. This causes an extremely low free hole injection efficiency into the QW active region and is a major obstacle for the realization of high performance DUV emitters based on AlGaN. Because of this low hole concentration, the devices must be driving at high currents to achieve certain optical power levels for any practical application, thereby significantly shortening the device operating lifetime.

The p-layer approach of the present invention is based on the acceptor energy levels of Mg (~0.5 eV) and Zn (~0.6 eV) in AlN determined by the co-inventors. It is apparent that the deepening of the Mg acceptor level in $Al_xGa_{1-x}N$ with increasing x is a fundamental physics problem and cannot be overcome by engineering. Therefore, a revolutionary approach for the incorporation of p-type layers in nitride DUV emitters to significantly enhance free hole injection is necessary.

The material of choice for new p-type layers in nitride DUV optoelectronic devices must satisfy the following criteria: the structure and materials system must be compatible with AlInGaN and AlN growth (so that single epi-growth are possible); it provides a lower acceptor energy level than Al-rich AlGaN; and the material's energy bandgap is higher than those in the QW active region. The hexagonal boron nitride (hBN) of the present invention satisfies all of the above criteria.

The stable phase of BN grown at any temperature and under normal pressure is hexagonal phase. The lattice mismatch is about 19.54% when hBN epilayer is grown on a c-plane AlN epilayer. However, it was noticed that 4 a-lattice constants of AlN (4 $a_{AlN}$=4×0.3112 nm=1.245 nm), is almost the same as 5 a-lattice constants of hBN (5 $a_{BN}$=5×0.2504 nm=1.252 nm), which means that every 5 hBN atoms will align with 4 AlN along a-direction as indicated in FIG. 3.

Figure 3:
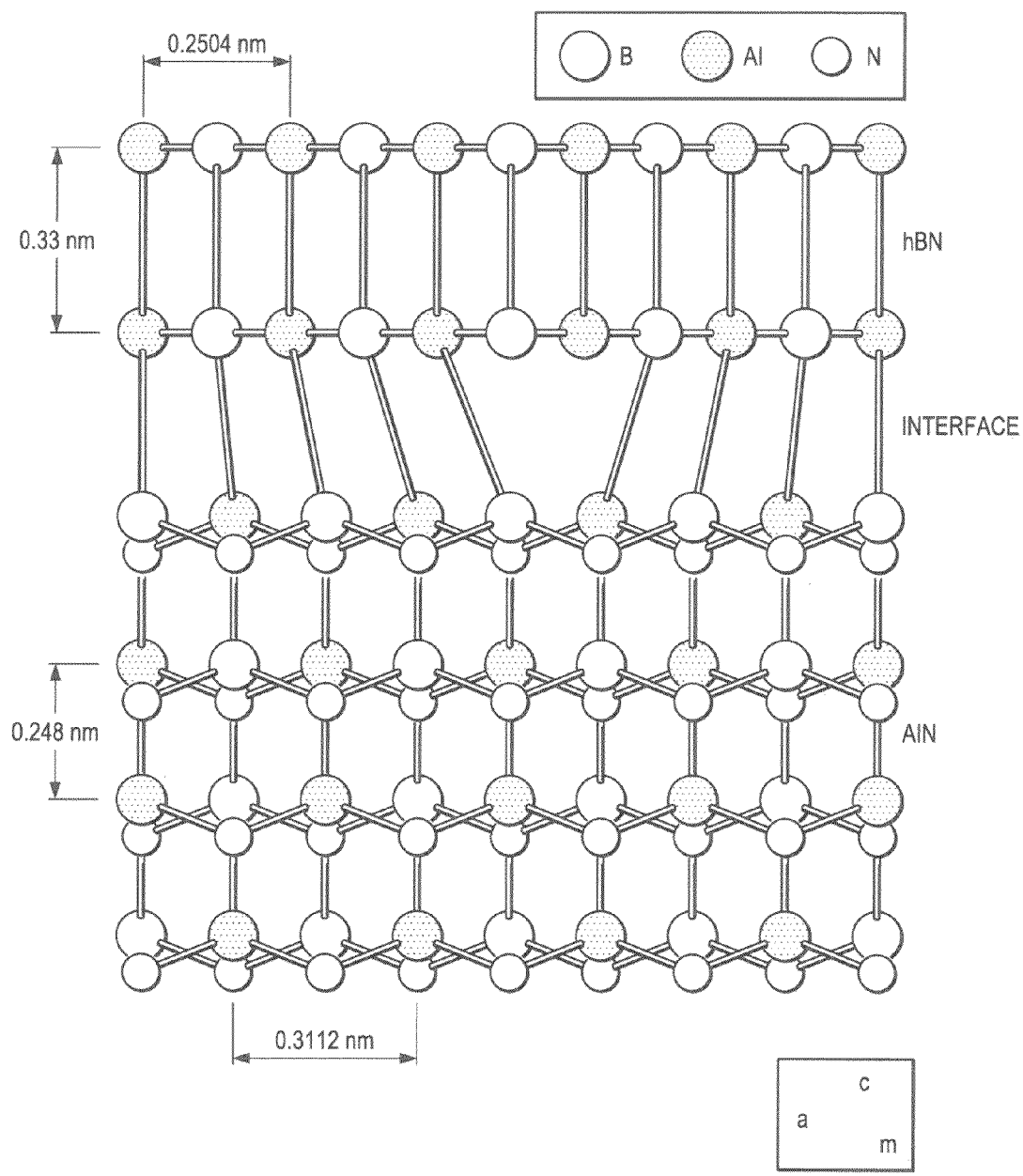
FIG. 3 is an illustration of heteroepitaxial growth of hBN on wurtzite AlN (w-AlN).

FIG. 3 is an illustration of heteroepitaxial growth of hBN on wutizite AlN (w-AlN). Note that 4 a-lattice constants of AlN, (4 $a_{AlN}$=4×0.3112 nm=1.245 nm) are almost the same as that of 5 a-lattice constants of hBN (5 $a_{BN}$=5×0.2504 nm=1.252 nm). This means that every 5 hBN atoms will align with 4 AlN along the a-direction. This 5/4 coincidence in the h-BN/w-AlN heterojunction interface effectively reduces the lattice mismatch from 19.54% to about 0.58%. As a result, high crystalline quality hBN epilayers can be grown on top of w-AlN or AlGaN by epitaxial growth techniques, which include those by chemical processes: chemical vapor deposition (CVD), metal organic chemical vapor deposition (MOCVD), hydride vapor phase epitaxy (HYPE), liquid phase epitaxy (LPE), etc., and those by physical processes: Molecular beam epitaxy (MBE), sputtering, pulsed laser deposition (PLD), and the like.

Figure 4B:
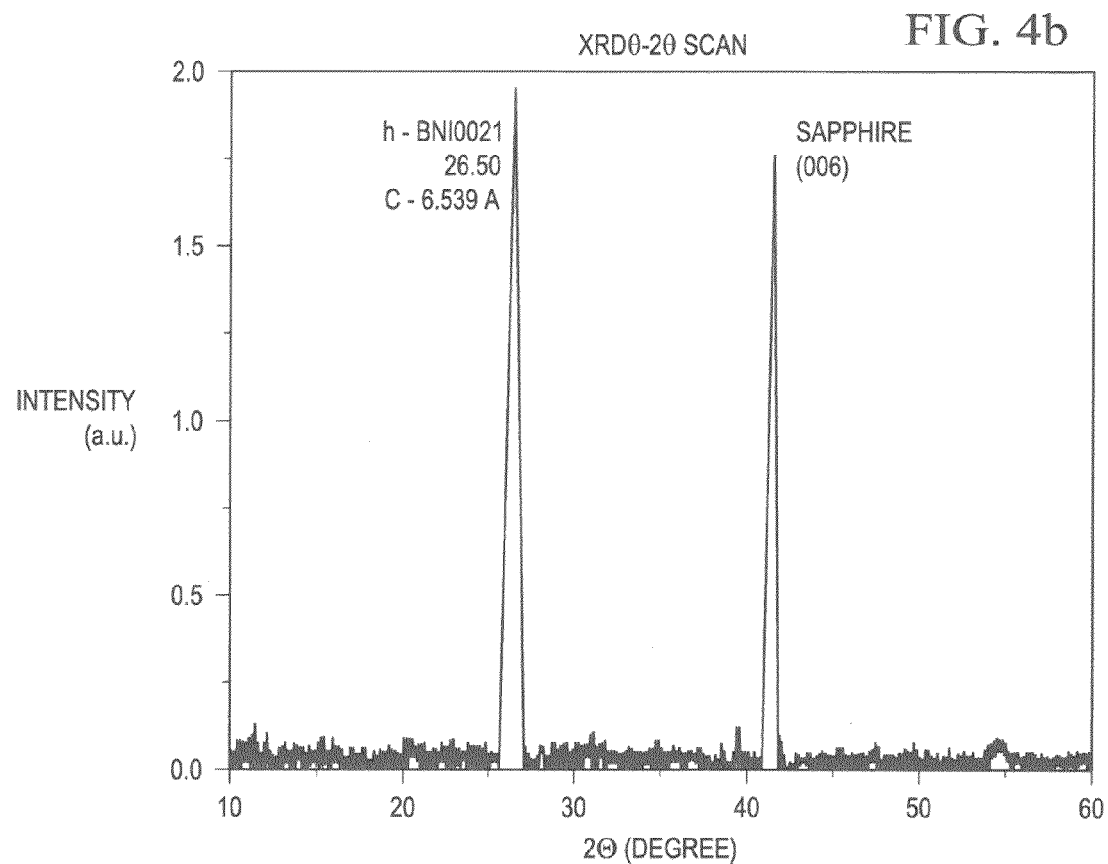
Figure 4C:
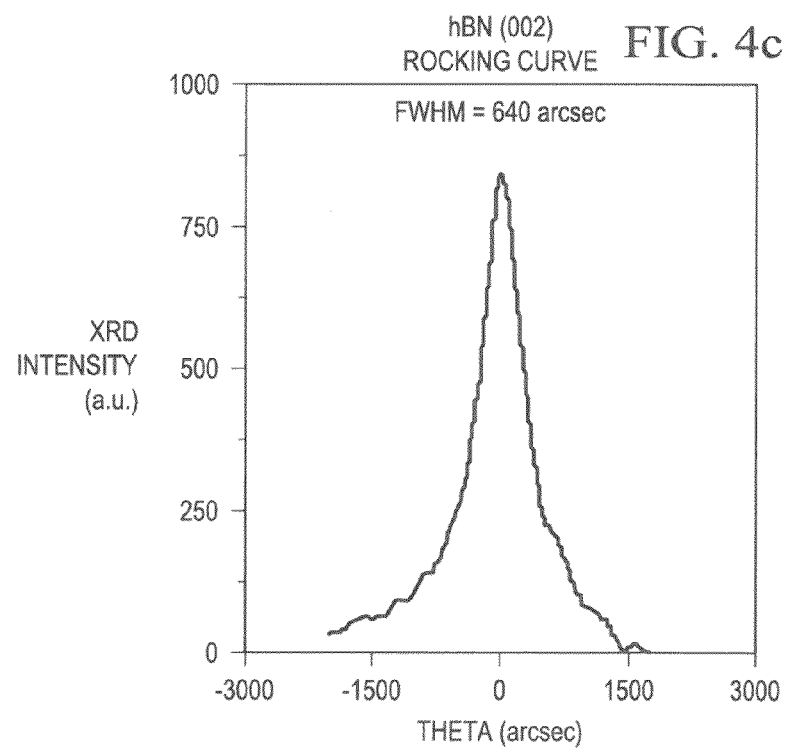
Figure 4D:
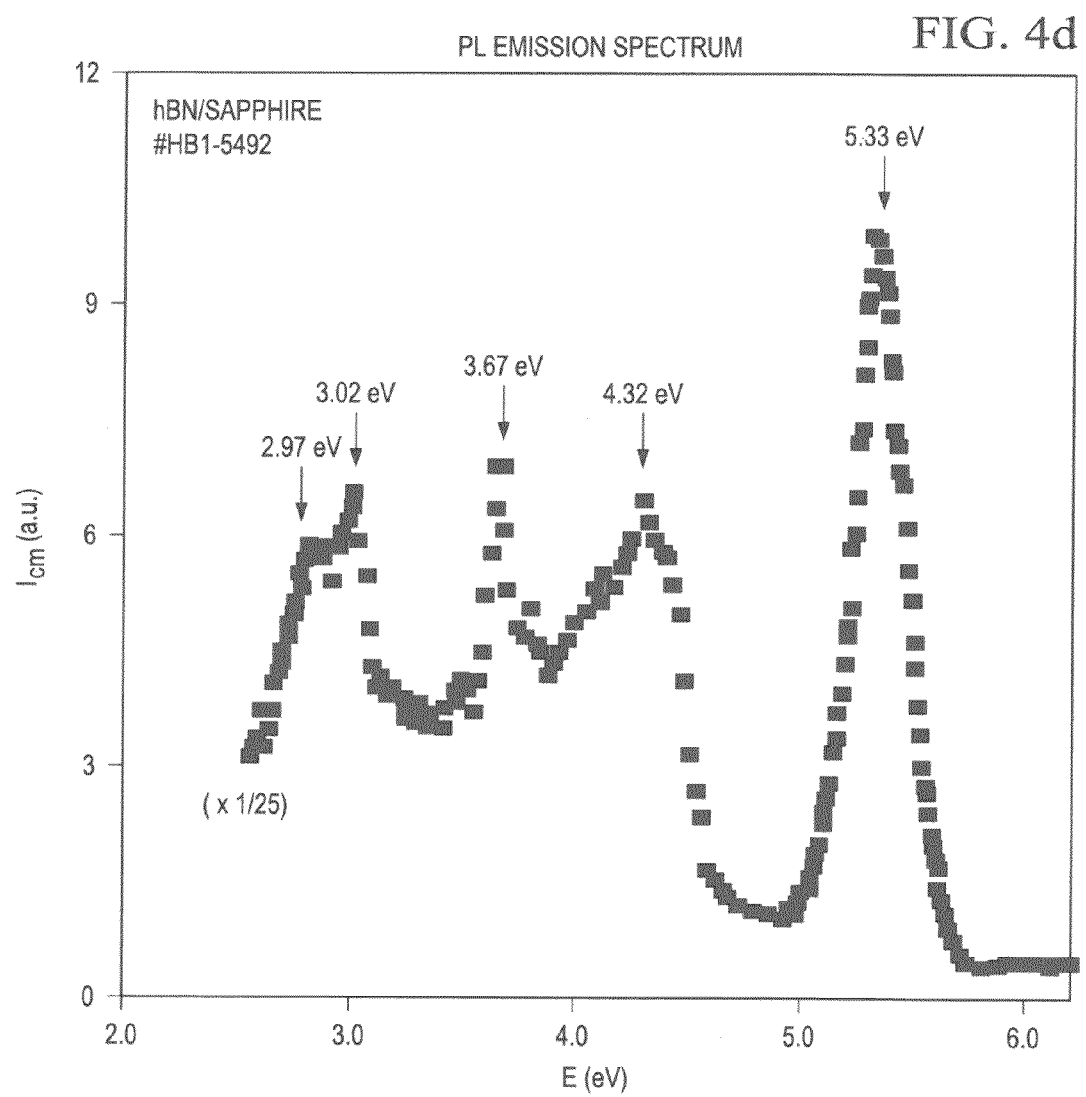
Figure 5A:
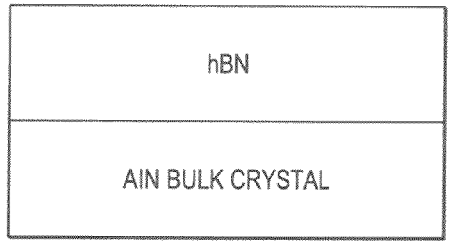
FIGS. 5a-f are schematic representations that show several basic material structures, which include hBN/AlGaN and AlGaN/hBN heterostructures with varying Al-contents.
Figure 5B:
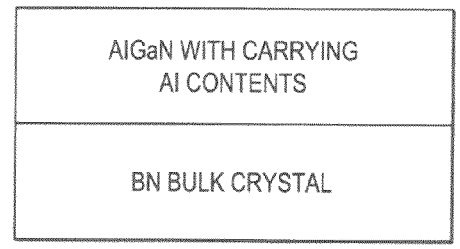
Figure 5C:
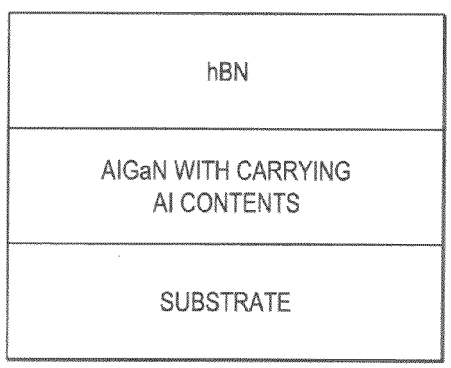
Figure 5D:
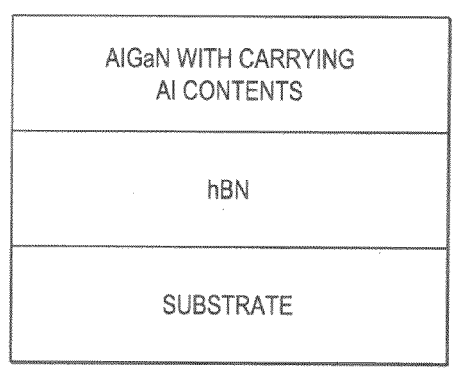
Figure 5E:
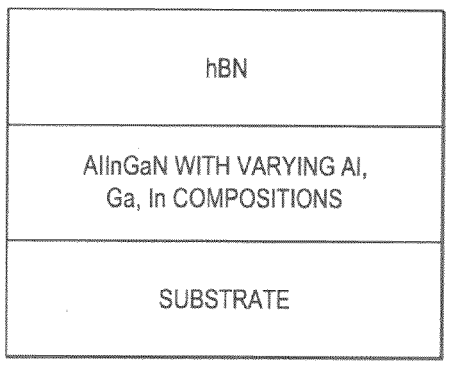
Figure 5F:
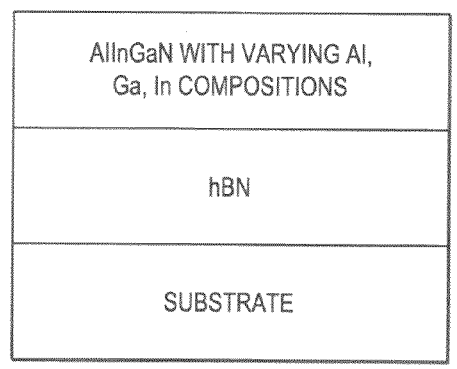

FIGS. 4a-d are graphs characterizing the undoped h-BN epilayers grown by metal organic chemical vapor deposition (MOCVD). FIG. 4a is a graph of the secondary ion mass spectrometry (SIMS) measurement results revealed that the hBN films of this invention have an excellent stoichiometry. FIG. 4b is a graph of the 6.689 Å c-lattice constant determined from XRD θ-2θ scan is almost equal to the bulk c-lattice constant of h BN (c=6.66 Å), conclusively demonstrating that the BN films are of single hexagonal phase. FIG. 4c is a graph of the first XRD rocking curve ever measured for the (002) plane of hBN epilayers, revealing the high crystalline quality of the hBN epilayers. FIG. 4d is a graph of the Photoluminescence emission spectrum which exhibits an optical transition line around 5.33 eV, implying relatively high optical quality. The epitaxial growth of high quality hBN epilayers is demonstrated on sapphire substrates and AlN/sapphire templates by MOCVD. The results shown in FIGS. 4a-d conclusively demonstrates that the BN films are of single hexagonal phase with high crystalline quality and that device quality hBN epilayers and heterojunction structures consisting of alternating layers of hBN/AlGaN can be realized by epitaxial growth techniques and the epi-growth of hBN and other III-nitride materials (AlInGaN) is completely compatible.

It has been demonstrated recently in BN films with predominantly hexagonal phase prepared by CVD, sputtering, and ion implantation[17-19], that the acceptor energy levels are 0.3 eV and 0.15 eV for Mg and Zn doped hBN, respectively. These values are much lower than the acceptor activation energy of about 530 meV in AlN. Since the free hole concentration (p) depends exponentially on acceptor energy level, $p\sim\exp(-E_A/kT)$, this reduced value in the acceptor activation energy will significantly increase the free hole concentration in the DUV devices and hence the QE.

hBN has a direct energy bandgap of about 6 eV[14], which is almost the same as that of pure AlN and is higher than those of III-nitride ternary (AlGaN and InGaN) or quaternary (AlInGaN) alloys that form the active layers in DUV emitters. This unique property together with lower acceptor activation energy will help nitride DUV emitters by helping electron blocking; and increasing hole injection into the AlGaN active region. This invention helps to solve the most important issues in next generation nitride DUV emitters by providing sufficient free hole injection into the QWs while minimizing the contact resistance, unwanted long wavelength emissions and heating generation. P-hBN has the potential to solve one of the most difficult issues in nitride DUV emitters with wavelength as low as 220 nm. The following basic material and device structures are disclosed based upon hBN/III-nitride heterostructures. All of the structures can be epitaxially grown on suitable substrates by chemical processes: CVD, MOCVD, HYPE, LPE, etc., and also by physical processes: MBE, sputtering, PLD, etc.

The present invention provides basic heterostructures based on hBN and III-nitrides (AlN, GaN, InN and their ternary and quaternary alloys and ternary BCN) and also p-n heterojunctions and p-hBN/n-hBN homojunctions grown on III-nitrides templates.

FIGS. 5a-f are schematic representations that show several basic material structures, which include hBN/AlGaN and AlGaN/hBN heterostructures with varying Al-contents; heterojunctions contain one of the following structures or the combinations of the following structures: i-hBN/(p-, i-, or n-AlGaN), p-hBN/(p-, i-, or n-AlIaN), n-hBN(p-, i-, or n-AlGaN), n-AlGaN/(p-, i-, or n-hBN), p-AlGaN/(p-, i-, or n-hBN), and i-AlGaN/(p-, i-, or n-hBN) with varying A-contents; heterojunctions contain one of the following structures or the combinations of the following structures: (p-, i-, or n-hBN)/n-AlInGaN, (p-, i-, or n-hBN)/p-AlInGaN, (p-, or n-hBN)/(i-AlInGaN), n-AlInGaN/(p-, i-, or n-hBN), p-AlInGaN/(p-, i-, or n-hBN), i-AlInGaN/(p-, i-, or n-hBN) with varying Al, In and/or Ga contents.

Figure 6A:
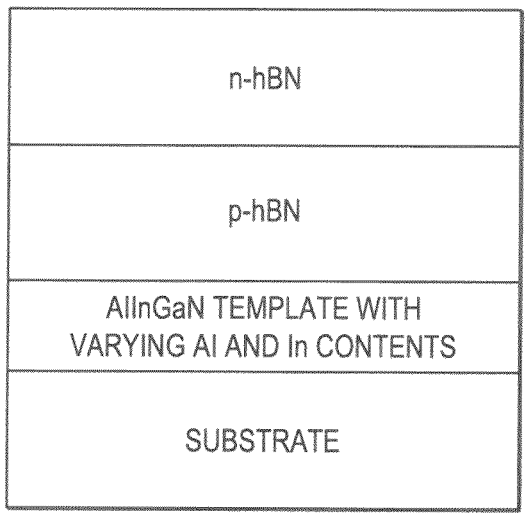
FIGS. 6a and 6b are schematic representations that show p-n junctions based on hBN.
Figure 6B:
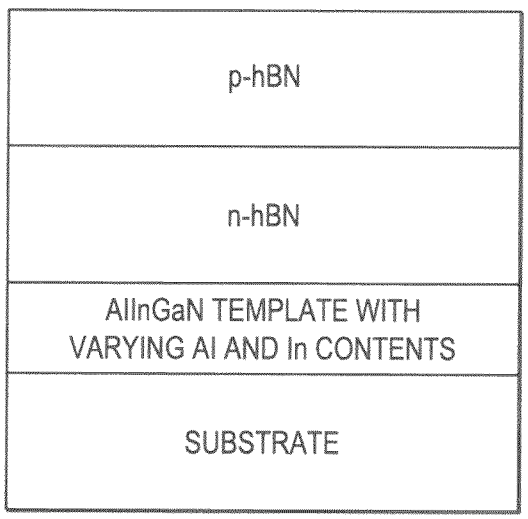

FIGS. 6a and 6b are schematic representations that show p-n junctions based on hBN of this invention, which include one of the following structures or the combinations of the following structures: p-hBN/n-hBN, p-hBN/i-hBN, and n-hBN/i-hBN and these hBN homojunctions are grown on suitable substrates or grown on suitable substrates using low temperature buffer layers or high temperature epilayer templates such as AlInGaN (Ga or In content can be varied) as dislocation filters. The present invention provides a revolutionary p-layer approach to overcome the intrinsic problem of low p-type conductivity (or low free hole concentration) in Al-rich AlGaN, and thus potentially provide orders of magnitude enhancement to the quantum efficiency of DUV emitters.

Figures 7A, 7B:
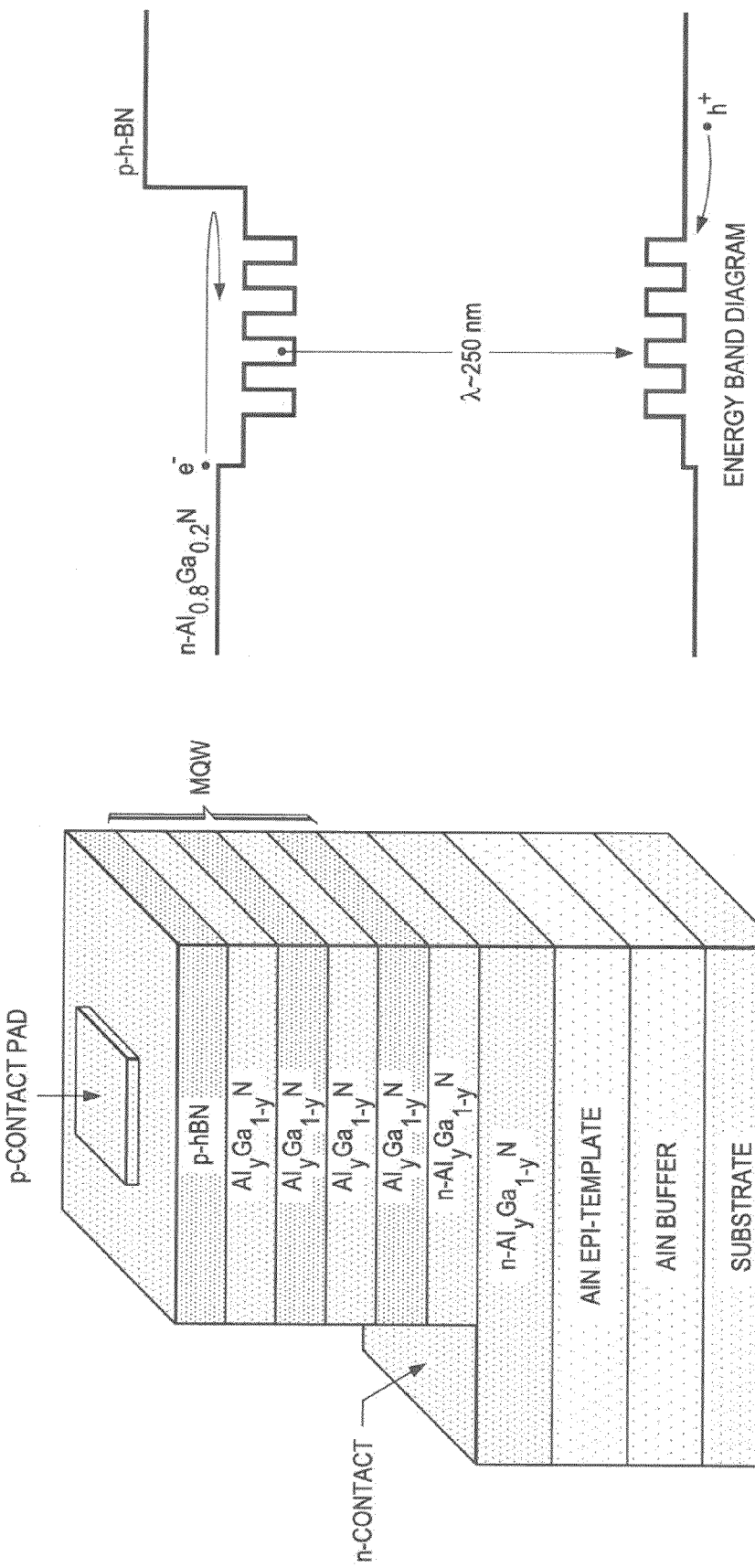
FIG. 7a illustrates a basic DUV emitter layer structure based on hBN/AlGaN bandgap and doping engineering and FIG. 7b is an image of the band gap.

FIG. 7a illustrates a basic DUV emitter layer structure based on hBN/AlGaN bandgap and doping engineering and FIG. 7b is an image of the band gap. Comparing with the conventional device structures shown in FIGS. 1a and 1b respectively, the high resistive p-AlGaN electron blocking layer and p-GaN contact layer are replaced by p-hBN. FIG. 7a is a schematic of a DUV emitter layer structure incorporating AlGaN QWs active layers and p-type hBN electron (e)-blocking layer and p-hBN contact layer of the present invention. The wide bandgap (~6 eV) p-hBN serves as a natural electron e-blocking and p-type contact layer and dramatically improves hole injection efficiency in DUV LEDs. The structure is based on the fact that hBN has a wider bandgap than those of AlGaN active layers, excellent p-type conductivity and transparency to DUV photons. FIG. 7b illustrates the corresponding energy band diagram of the DUV emitter layer structure shown in FIG. 7a. The distinctive advantageous features of the structure of the present invention include enhanced hole injection efficiency. By implementing the new direct wide bandgap (~6 eV)[15] and highly conductive hBN p-type layer strategy in nitride DUV emitters, p-type conductivity of the electron blocking layer will be dramatically increased. This significantly improves free hole injection and quantum efficiency, reducing the operating voltage and heat generation, and increasing the device operating lifetime. Another advantage of the structure of the present invention is the reduced contact resistance, UV light absorption, and manufacturing costs. Highly conductive hBN will also be used as a p-contact layer. The contact resistance, operating voltage, and light absorption in the DUV region will be dramatically reduced compared to the conventional approach of using p-GaN. Furthermore, the elimination of Al-rich AlGaN electron blocking layers, which often employ multiple-quantum-barriers or superlattices to enhance the effectiveness of electron blocking, will reduce the manufacturing costs. The implementation of highly conductive p-hBN contact layers will significantly increase the manufacturing yield.

Figures 8A, 8B:
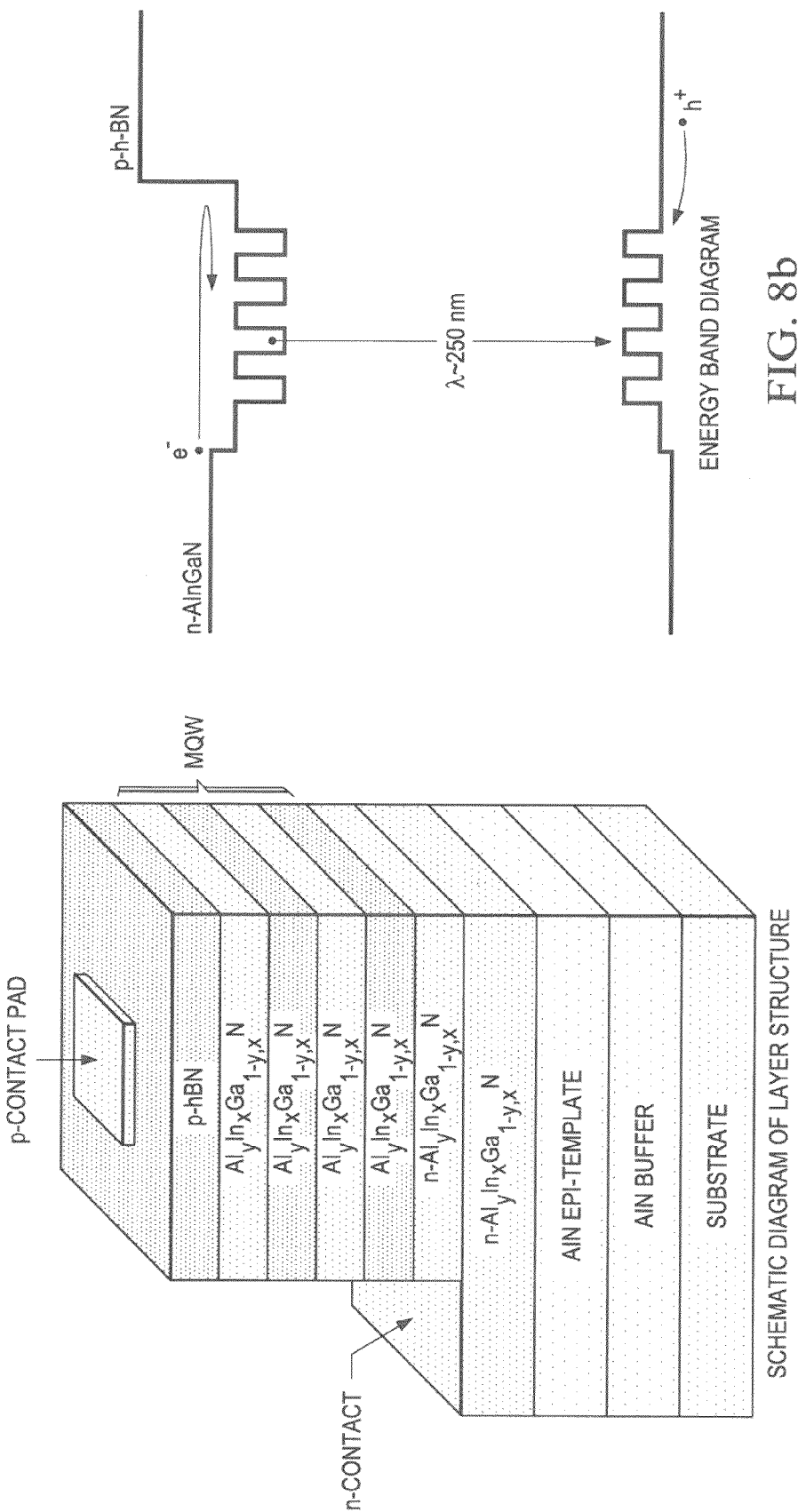
FIG. 8a is a schematic of a DUV emitter layer structure employing AlInGaN quaternary alloys and FIG. 8b is an energy band diagram.

FIG. 8a is a schematic of a DUV emitter layer structure employing AlInGaN quaternary alloys and FIG. 8b is an energy band diagram. FIG. 8a, there is illustrates another preferred embodiment in which all the ternary AlGaN alloys (in the device structures as shown in FIG. 7a) are replaced by AlInGaN quaternary alloys for certain applications. The compositions of AlInGaN can be varied to achieve intended emission wavelength, better lattice match, or other specific functions: The wide bandgap (~6 eV) p-hBN serves as a natural e-blocking and p-type contact layer and dramatically improves hole injection efficiency in DUV LEDs. The structure is based on the fact that hBN has a wider bandgap than those of AlInGaN active layers, excellent p-type conductivity and transparency to DUV photons. FIG. 8b illustrates the corresponding energy band diagram of the DUV emitter layer structure shown in FIG. 8a.

Figures 9A, 9B:
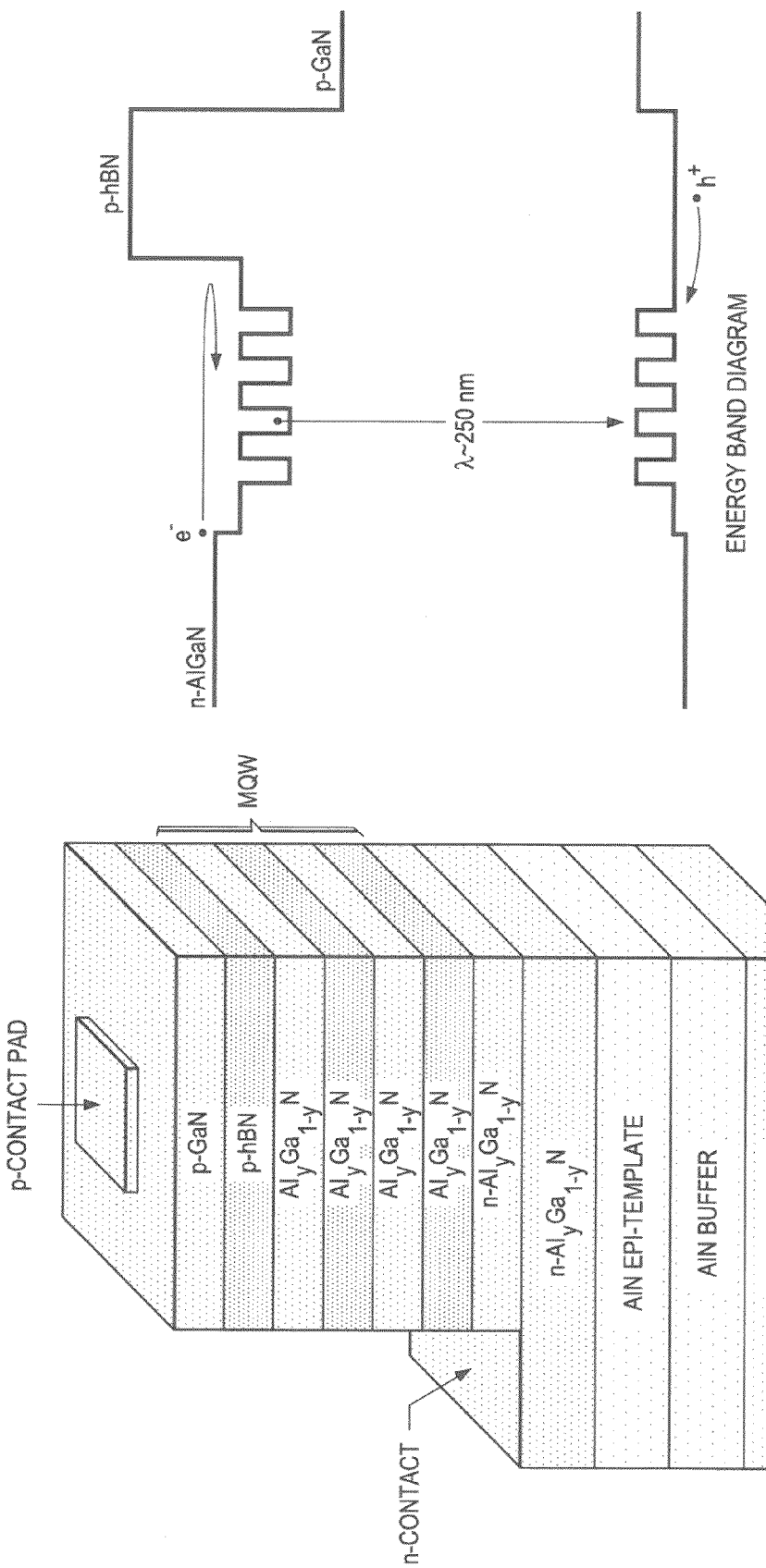
FIG. 9a is a schematic of a DUV emitter layer structure employing highly conductive p-hBN and FIG. 9b is an energy band diagram.

FIG. 9a is a schematic of a DUV emitter layer structure employing highly conductive p-hBN and FIG. 9b is an energy band diagram. FIG. 9a illustrates another preferred embodiment in which highly conductive p-hBN replaces the high resistive p-AlGaN (in the conventional structure shown in FIG. 1) as the electron blocking layer. This structure provides significantly enhanced p-type conductivity of the electron blocking layer and also electron blocking capability and hence improves free hole injection and quantum efficiency (QE), reducing the operating voltage and heat generation, and increasing the device operating lifetime. The wide bandgap (~6 eV) p-hBN serves as a natural e blocking layer and dramatically improves hole injection efficiency in DUV LEDs. The structure is based on the fact that hBN has a wider bandgap than those of AlGaN active layers and excellent p-type conductivity. FIG. 9b illustrates the corresponding energy band diagram of the DUV emitter layer structure shown in FIG. 9a.

FIG. 10a is a schematic of a DUV emitter layer structure including AlInGaN quaternary alloys and FIG. 10b is an energy band diagram. FIG. 10a illustrates another preferred embodiment in which all the ternary AlGaN alloys (in the device structures as seen in FIG. 9a) are replaced by AlInGaN quaternary alloys for certain applications. The compositions of AlInGaN can be varied to achieve intended emission wavelength, improved lattice matches, or other specific functions. The wide bandgap (~6 eV) p-hBN serves as a natural e blocking layer and dramatically improves hole injection efficiency in DUV LEDs. The structure is based on the fact that hBN has a wider bandgap than those of AlInGaN active layers and excellent p-type conductivity. FIG. 10b illustrates the corresponding energy band diagram of the DUV emitter layer structure shown in FIG. 10a.

FIG. 11a is a schematic of a DUV emitter layer structure including p-AlInGaN quaternary alloys and FIG. 11b is an energy band diagram. FIG. 11a illustrates another preferred embodiment in which the p-GaN contact in the device structure of FIG. 10a is replaced by p-AlInGaN quaternary alloys for certain applications. The compositions of AlInGaN can be varied to achieve specific functions. The wide bandgap (~6 eV) p-hBN serves as a natural e-blocking layer and dramatically improves hole injection efficiency in DUV LEDs. The structure is based on the fact that hBN has a wider bandgap than those of AlInGaN active layers and excellent p-type conductivity. FIG. 11b illustrates the corresponding energy band diagram of the DUV emitter layer structure shown in FIG. 11a. The semiconductor emitter structures based on hBN/AlGaN heterostructure (as shown in FIGS. 7-12) are used as examples in the invention description, it is understandable that the present invention can also be used to construct UV light emitting devices based on other alloy compositions, such as AlInGaN with varying Al, Ga, or In compositions, as well as insertion of more layers or deletion of some layers, or other semiconductor materials with different emitting wavelengths. The present invention also provides basic Schottky and p-n junction diodes built from ultra-high band gap semiconductors, which form the heart of many other optoelectronics devices such as detectors function in DUV and EUV spectral range and as nuclear radiation detectors.

Figure 12:
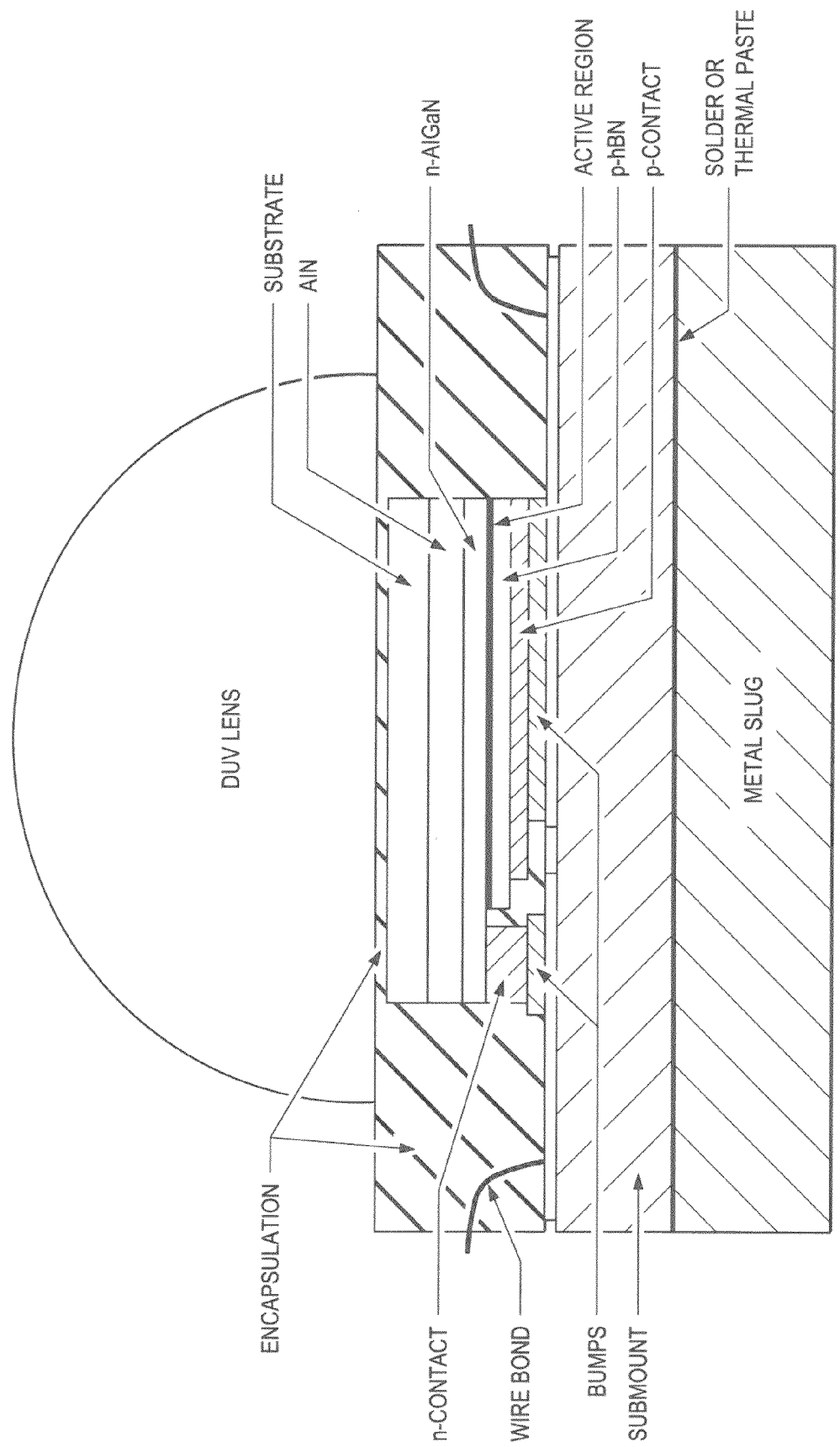
FIG. 12 is a cross sectional view of a flip-chip bonded UV/DUV LED constructed from phBN/AlGaN hetero structure.
Figure 13A:
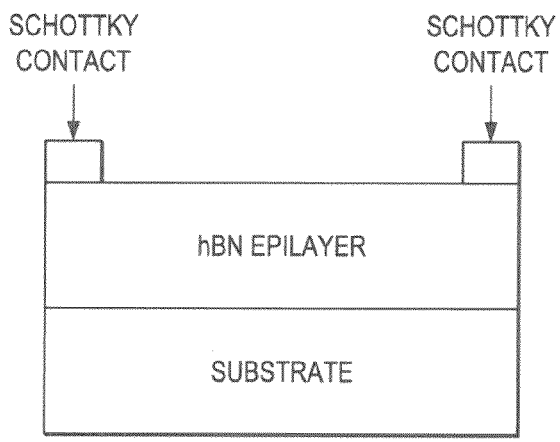
FIGS. 13a-h are schematics of several examples of detector structures based on (FIGS. 13a-c) metal-semiconductor-metal (MSM) and (FIGS. 13d-h) Schottky diode detector structures.
Figure 13B:
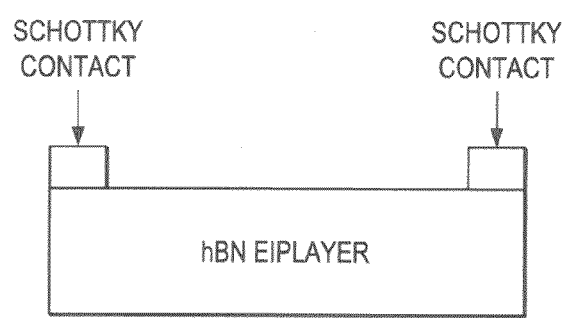
Figure 13C:
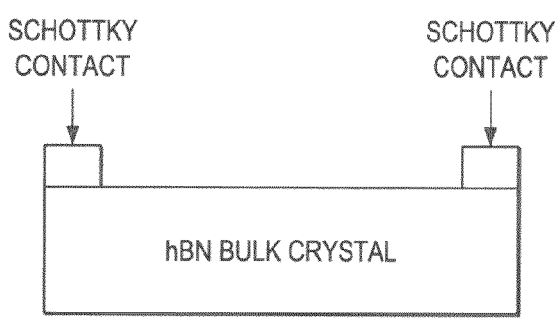
Figure 13D:
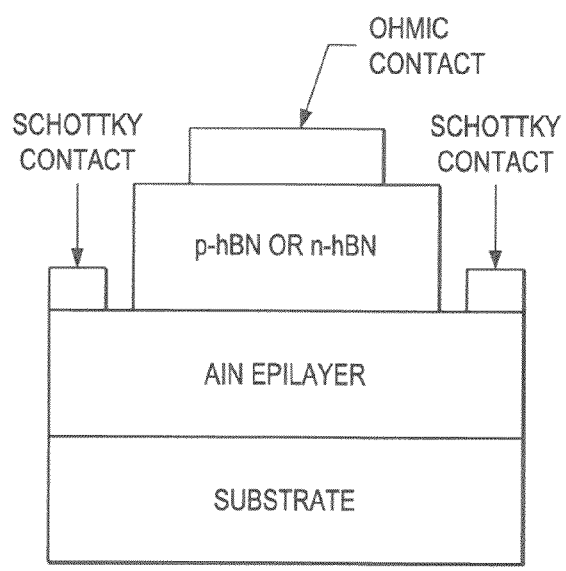
Figure 13E:
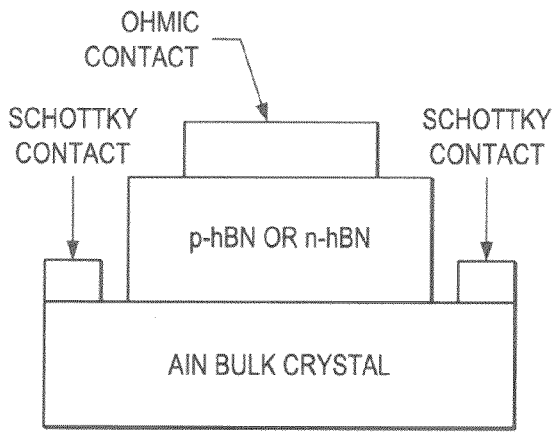
Figure 13F:
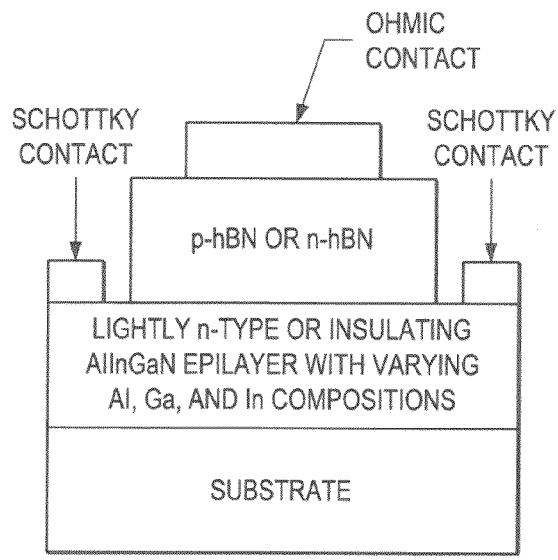
Figure 13G:
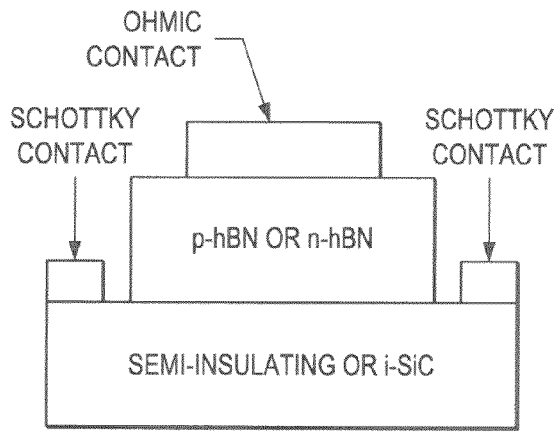
Figure 13H:
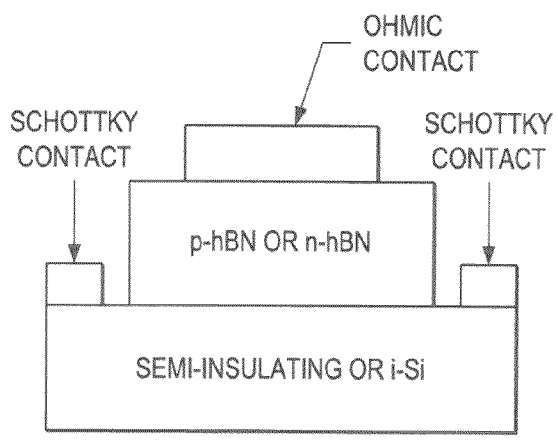
Figure 14A:
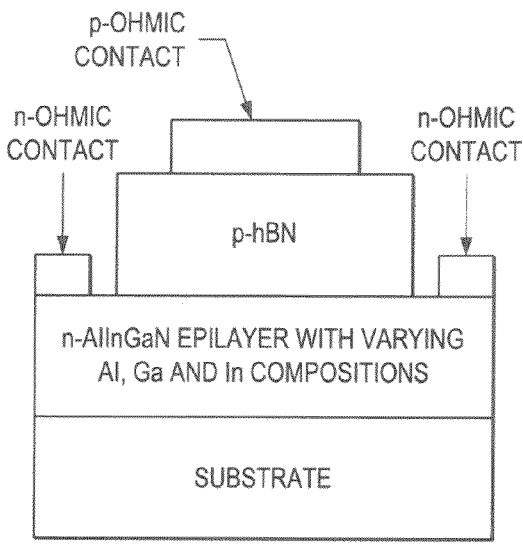
FIGS. 14a-h are schematics of several examples of detectors based on p-n junctions.
Figure 14B:
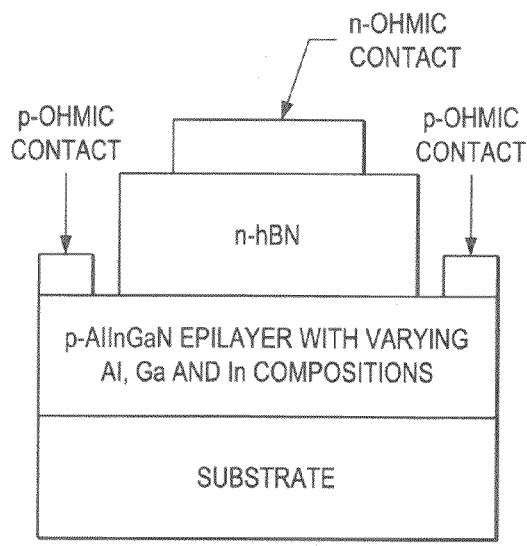
Figure 14C:
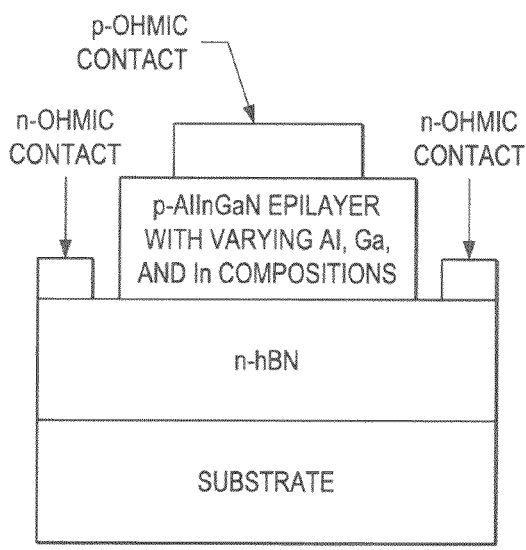
Figure 14D:
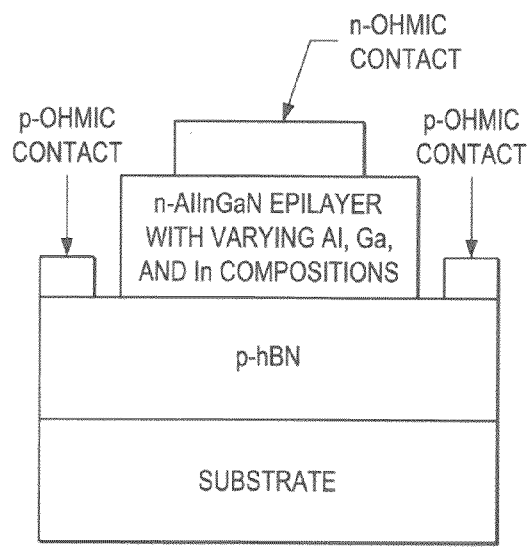
Figure 14E:
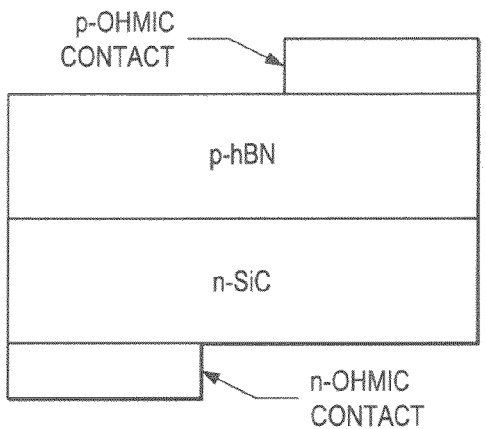
Figure 14F:
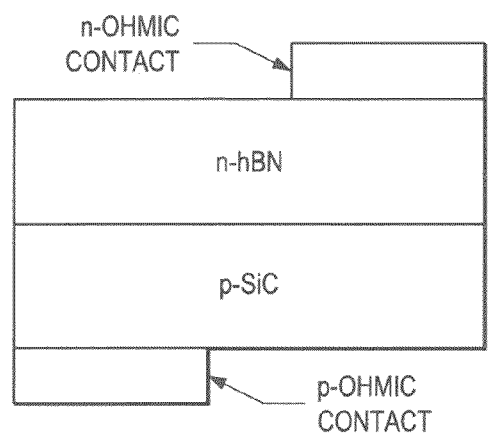
Figure 14G:
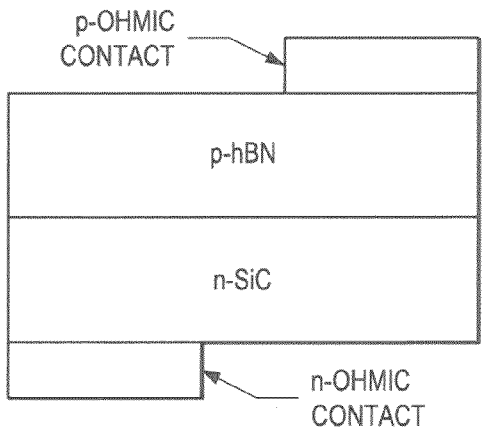
Figure 14H:
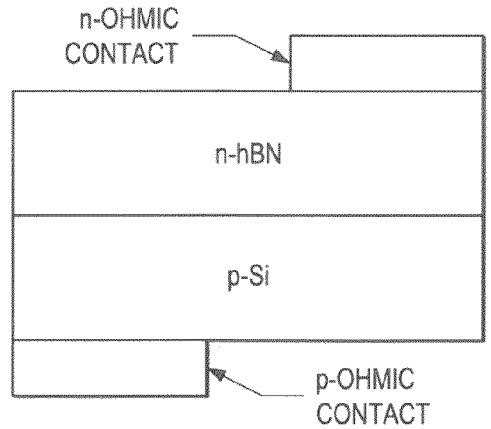

FIG. 12 is a cross-sectional view of a flip-chip bonded UV/DUV LED constructed from phBN/AlGaN hetero-structure mounted in a custom package with hemisphere encapsulation molded from UV/DUV transparent polymers for enhanced performance. The device performance will further enhance the incorporation of advanced device architectures such as photonic crystals, micro-emitter arrays and flip-chip packaging.

FIGS. 13a-h are schematics of several examples of detector structures, based on (FIGS. 13a-c) metal-semiconductor-metal (MSM) and (FIGS. 13d-h) Schottky diode detector structures, including but not limited to hBN/substrate, free standing hBN films (obtained by substrate removal), hBN bulk crystals, n- or p-hBN/AlN, n- or p-hBN/AlInGaN (with varying Al, Ga, and In contents), n- or p-hBN/Si, n- or p-hBN/SiC.

FIGS. 14a-h are schematics of several examples of detectors based on p-n junctions including p-hBN/n-AlInGaN (with varying Al, Ga, and In contents) or n-hBN/p-AlInGaN or p-hB/n-hBN or p-hBN/n-SiC or n-hBN/p-SiC (with varying SiC polytypes) or p-hBN/n-Si or n-hBN/p-Si. The semiconductor diodes based on hBN shown in FIGS. 13a-h and FIGS. 14a-h are used as examples in the invention description, it is understandable that the present art can also be used to construct optoelectronics device based on other alloy compositions, such AlInGaN with varying Al, Ga, or In compositions, as well as insertion of more layers or deletion of some layers, or other semiconductor materials that function in different spectral range.

Solid-state neutron detector efficiency exceeding that of hexagonal boron nitride $^3$(He) tubes is highly desirable since thermal neutrons are a very specific indicator of nuclear weapons and because there are significant shortages of $^3$He. The present invention also provides an ideal solid-state detector by leveraging the unique properties of hBN. The boron isotope $^{10}$B is favorable for thermal neutron capture due to its large capture cross-section of 3837 barns, which is orders of magnitude larger than that of most elements. The $^{10}$B isotope reacts with a neutron to produce charged lithium nuclei and alpha particles via the reaction: n+$^{10}$B->α+$^7$Li.$^{22}$ Current solid-state neutron detectors are generally fabricated in a planar configuration by coating a layer of boron containing neutron-to-alpha particle converter material onto a semiconductor such as Si. The efficiency of these devices is limited due to the conflicting thickness requirements of the converter layer: The boron layer must be thick enough (>100 μm) to capture the incoming neutron flux, yet sufficiently thin (2 to 3 μm) to allow the α particles to penetrate into the semiconductor layer to generate electrons and holes. Pillar semiconductor detectors have been developed, which are constructed by etching sub-micron pillars with very high aspect ratios and filling the holes with boron containing materials. These devices with three dimensional matrix structures have improved efficiericies over the planar boron-coated detectors. Some signal is lost by energy absorption in the matrix. Moreover, the geometry of such an etched pillar structure would be less mechanically robust. The efficiency of solid-state detectors can be dramatically improved by combining neutron capture and charge collection layers together in a single boron-based semiconductor. It was shown recently that at similar dimensions, detectors fabricated from a natural composition of hBN microcrystals embedded in a polystyrene binder matrix are far more efficient than $^3$(He), which conveys the potential of hBN for thermal neutron detection. To realize the full potential of hBN, device quality hBN films grown by state-of-the-art epitaxial growth techniques such as MOCVD are required in order to realize large area and high efficiency devices through precise epitaxial and doping engineering. With the realization of high quality hBN epilayers, as shown in FIG. 4, the present invention also provides ideal solid-state neutron detectors by leveraging the unique properties of hBN, such as wide energy band gap (~6 eV). It has the widest bandgap among all boron compound semiconductors (~6 eV) and a very high resistivity for an undoped material (>$10^9$ Ω·cm); thus BN diodes will have low reverse bias leakage currents and low noise. Conductivity control is another unique property of hBN. It can be doped with impurities to produce both n- and p-type, so BN Schottky or p-n junction diodes, which are sensitive detectors, can be fabricated. A BN device is also mechanically strong and chemically inert and can be imparted with tremendous durability. High performance MSM and Schottky diode detector can easily be constructed using the basic hBN/substrate, hBN films, n- or p-hBN/AlInGaN heterojunction.

In addition to the radiation detector structures shown in FIGS. 13a-h and FIGS. 14a-h, a preferred embodiment is the implementation of a multi-stacked device architecture, as illustrated in FIGS. 15 and 16. The stacked device architecture will satisfy the thickness requirement for capturing a high percentage of neutrons while the individual detector is thin enough (2 to 3 μm) to accommodate short mean free paths of charged particles.

Figure 15A:
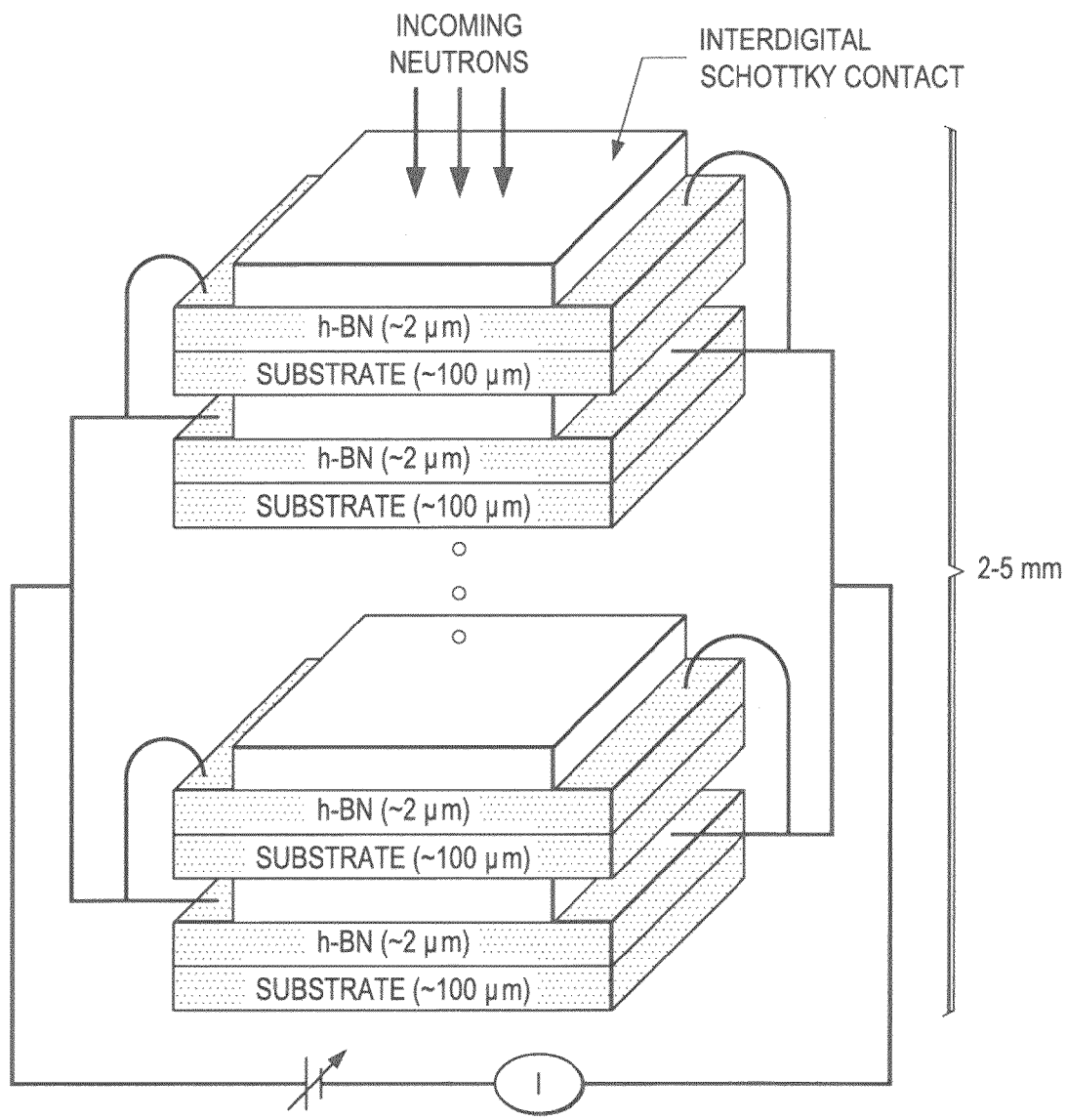
FIGS. 15a-b are images of illustrations of BN neutron detectors of the present invention, employing multi-stacked diodes based on hBN pin (n-hBN/i-hBN/phBN) junction.
Figure 15B:
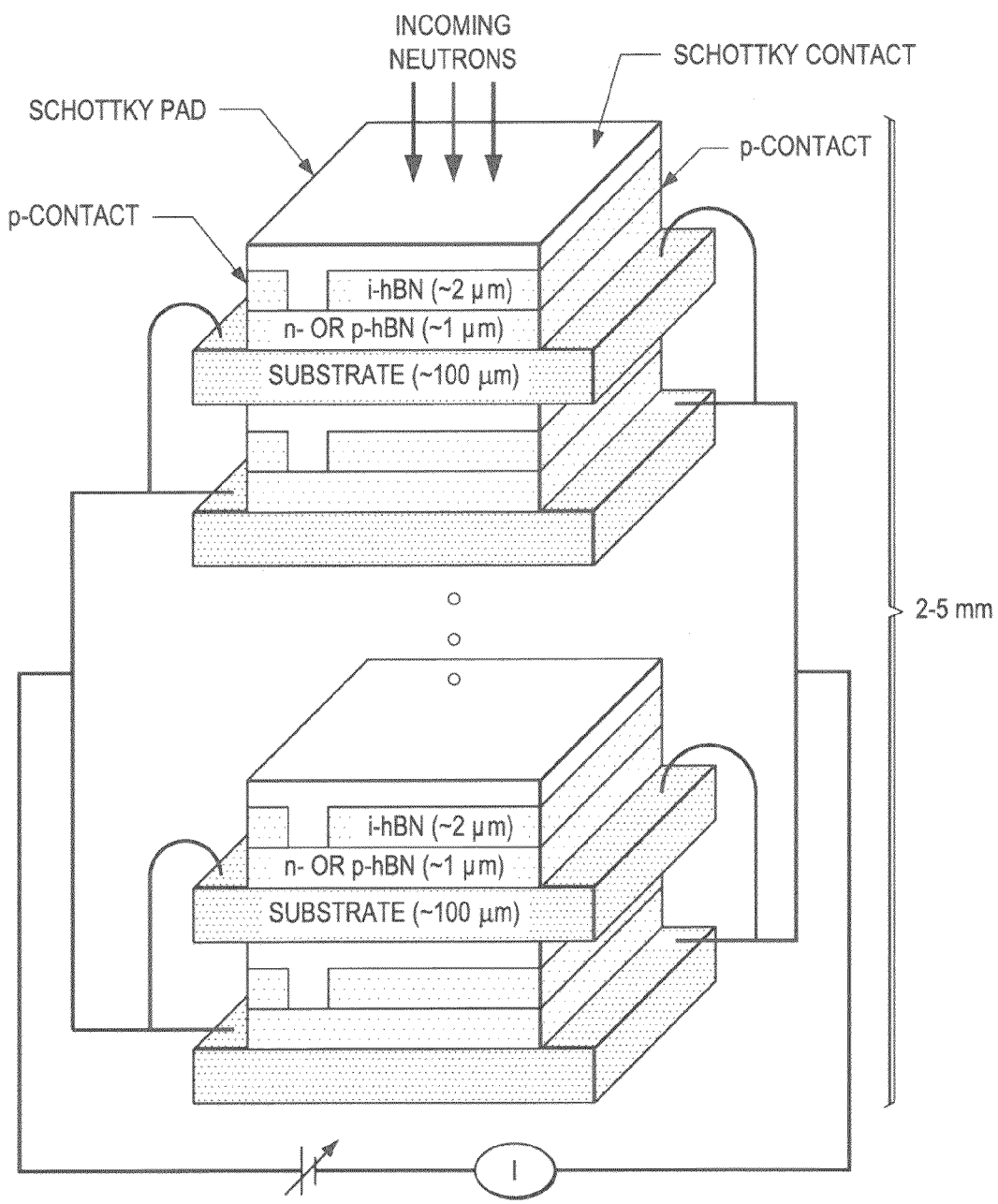

FIGS. 15a-b are images of illustrations of BN neutron detectors of the present invention, employing multi-stacked diodes based on FIG. 15a metal-semi-conductor-metal (MSM) structure and FIG. 15b Schottky diode structure to significantly enhance charge collection efficiency. The device structures have a total active layer thickness satisfying the thickness required for capturing all neutrons while the individual detector is thin enough (around 2 or 3 µm) to accommodate short mean free paths of charged carriers.

Another preferred embodiment is the structure shown in FIG. 16, which incorporates p-BN and n-BN with tunneling junctions. Similar approach has been employed and proven in high efficiency multi junction solar cells. This structure has the potential to satisfy the stringent requirements of an ideal neutron detector: The total BN layer is thick enough to capture all incoming neutrons and to collect all charged particles, while the carrier diffusion length is still determined by a conventional p-i-n junction (~2 µm) to provide large detection signals. The total thickness required to achieve a favorable detection efficiency will be reduced by a factor of about 5 by incorporating hBN epilayers grown using a $^{10}$B enriched starting source, since hBN crystals have the natural abundance of $^{10}$B about 20% in general.

Hexagonal boron nitride (hBN) has emerged as an important material for various device applications and as a template for graphene electronics. Low-dimensional hBN is expected to possess rich physical properties, similar to graphene. The synthesis of wafer-scale semiconducting hBN epitaxial layers with high crystalline quality and electrical conductivity control has not been achieved but is highly desirable. Large area hBN epitaxial layers (up to 2 in., in diameter) were synthesized by metal organic chemical vapor deposition. P-type conductivity control was attained by in situ Mg doping. Compared to Mg-doped wurtzite AlN, which possesses a comparable energy band gap (6 eV), dramatic reductions in Mg acceptor energy level and P-type resistivity (by about six to seven orders of magnitude) have been realized in hBN epilayers. The ability of conductivity control and wafer-scale production of hBN opens up tremendous opportunities for emerging applications, ranging from revolutionizing p-layer approach in III-nitride deep ultraviolet optoelectronics to graphene electronics.

Micro-strip metal-semiconductor-metal detectors for thermal neutron sensing were fabricated from hexagonal boron-nitride (hBN) epilayers synthesized by metal organic chemical vapor deposition. Experimental measurements indicated that the thermal neutron absorption coefficient and length of natural hBN epilayers are about 0.00361 µm$^{-1}$ and 277 µm respectively. A continuous irradiation with a thermal neutron beam generated an appreciable current response in hBN detectors, corresponding to an effective conversion efficiency approaching 80% for absorbed neutrons. Our results indicate that hBN semiconductors would enable the development of essentially ideal solid-state thermal neutron detectors in which both neutron capture and carrier collection are accomplished in the same hBN semiconductor. These solid-state detectors have the potential to replace $^3$He gas detectors, which faces the very serious issue of $^3$He gas shortage.

Hexagonal boron nitride (hBN) possesses extraordinary physical properties such as ultrahigh chemical stability and band gap (Eg~6 eV) and negative electron affinity. Due to its unique layered structure and close in-plane lattice match to graphene, low-dimensional hBN is expected to possess rich physical properties and could also be very useful as a template for graphene electronics. Due to its high band gap and in-plane thermal conductivity, hBN has been considered both as an excellent electrical insulator and thermal conductor. However, lasing action in deep ultraviolet (DUV) region (~225 nm) by electron beam excitation was demonstrated in small hBN bulk crystals synthesized by a high pressure/temperature technique, raising its promise as a semiconducting material for realizing chip-scale DUV light sources/sensors. DUV (λ<280 nm) devices are highly useful in areas such as probing intrinsic fluorescence in a protein, equipment/personnel decontamination, and photocatalysis. Synthesizing wafer-scale semiconducting hBN epitaxial layers with high crystalline quality and electrical conductivity control has not been achieved but is highly desirable for the exploration of emerging applications. We report on the growth and basic properties of undoped and Mg-doped hBN epilayers grown on sapphire. Our results indicate that (a) hBN epitaxial layers exhibit outstanding semiconducting properties and (b) hBN is the material of choice for DUV optoelectronic devices.

Hexagonal BN epitaxial layers were synthesized by metal organic chemical vapor deposition using triethylboron source and ammonia (NH3) as B and N precursors, respectively. Prior to epilayer growth, a 20 nm BN or AlN buffer layer was first deposited on sapphire substrate at 800° C. The typical hBN epilayer growth temperature was about 1300° C. For the growth of Mg-doped hBN, biscyclopentadienyl-magnesium was transported into the re reactor during hBN epilayer growth. Mg-doping concentration in the epilayers used in this work was about 1×10$^{19}$ cm$^{-3}$, as verified by secondary ion mass spectrometry (SIMS) measurement (performed by Charles and Evan). X-ray diffraction (XRD) was employed to determine the lattice constant and crystalline quality of the epilayers. Photoluminescence (PL) properties were measured by a DUV laser spectroscopy system. Hall-effect and standard Van der Pauw measurements were employed to measure the whole concentration and mobility and electrical conductivity. Seebeck effect (or hot probe) measurement was performed to further verify the conductivity type.

Figure 16A:
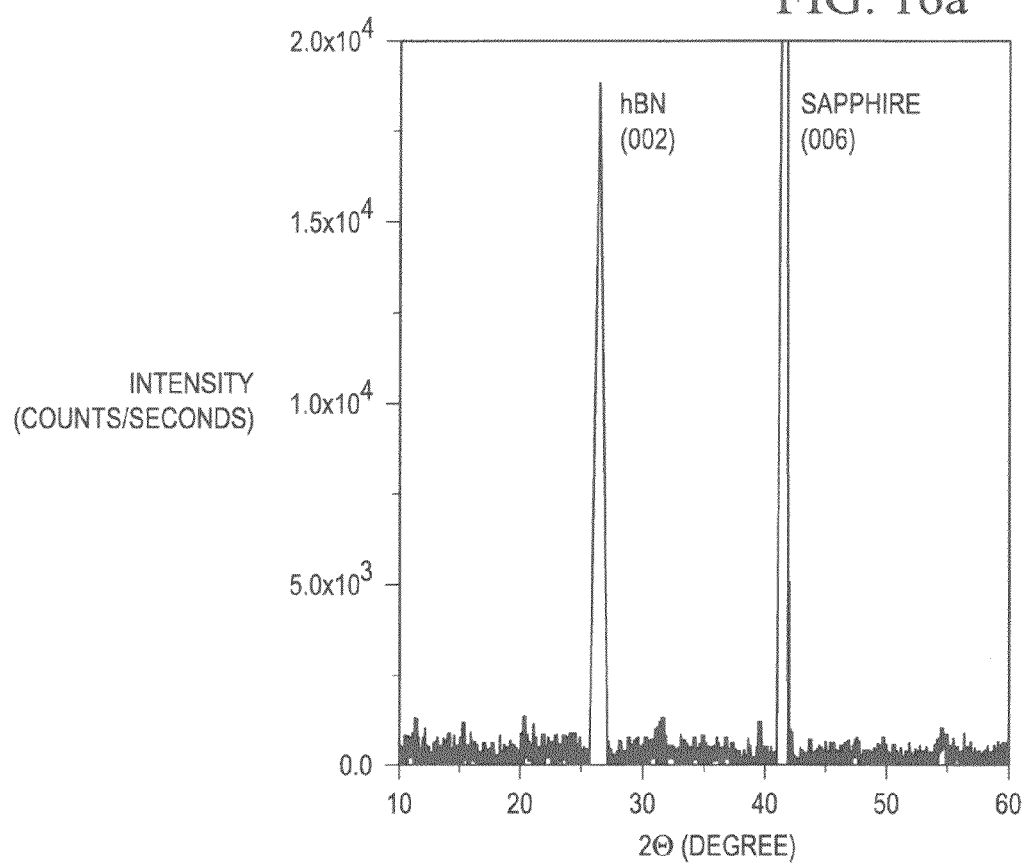
FIG. 16a is an XRD θ-2θ scan showing a c-lattice constant ~6.67 Å.
Figure 16B:
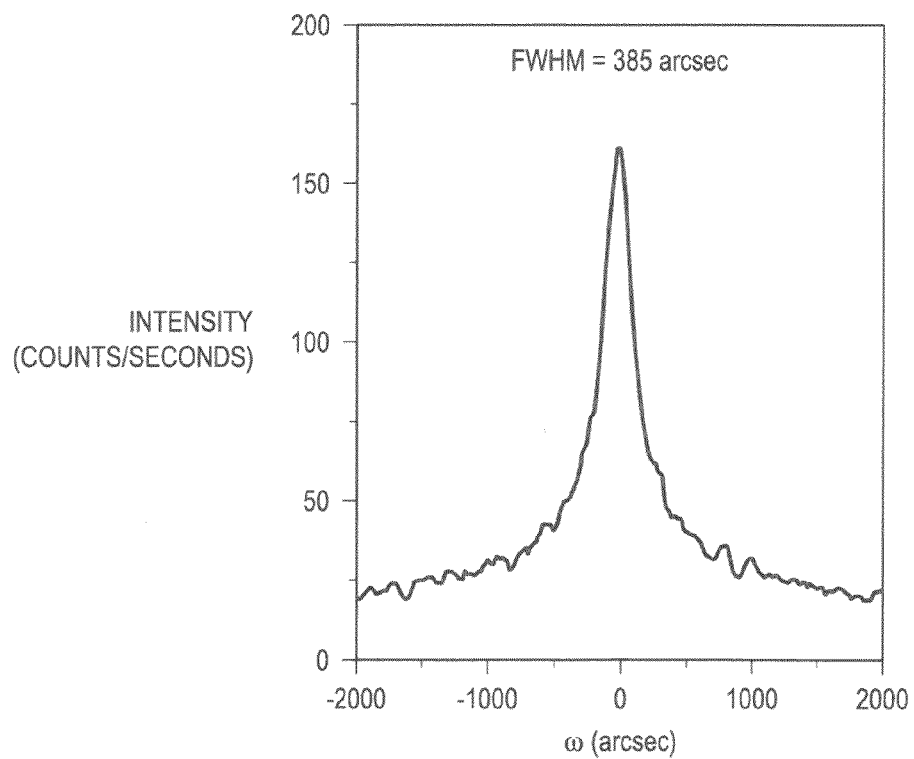
FIG. 16b is the XRD rocking curve of the (002) reflection of a 1 μm thick film.

FIG. 16a is an XRD θ-2θ scan showing a c-lattice constant ~6.67 Å, which closely matches to the bulk c-lattice constant of hBN (c=6.66 Å), affirming that BN films are of single hexagonal phase. FIG. 16b is the XRD rocking curve of the (002) reflection of a 1 µm thick film. The observed line width is comparable to those of typical GaN epilayers grown on sapphire with a similar thickness.

Figure 17A:
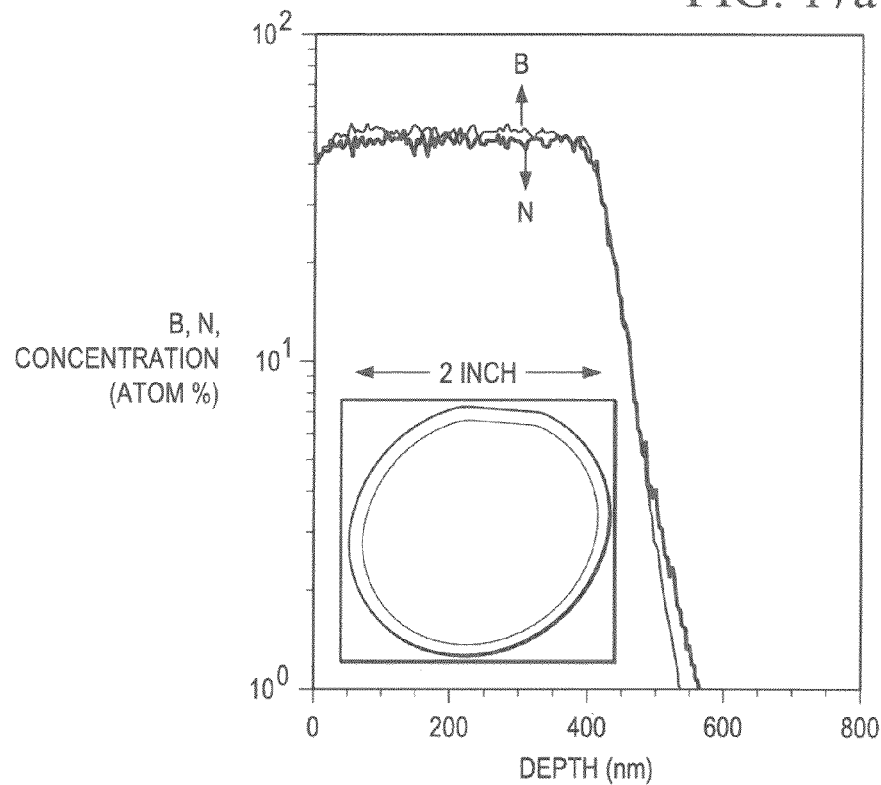
FIG. 17a is an image of a SIMS measurement.
Figure 17B:
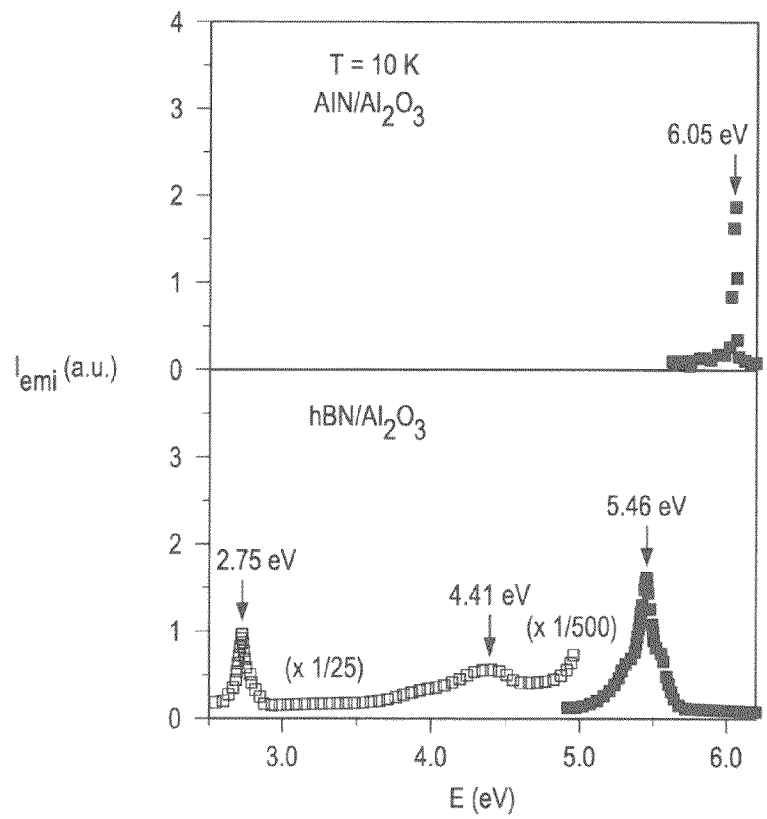
FIG. 17b is a low temperature PL spectrum, which exhibits a dominant emission line at ~5.46 eV.

FIG. 17a is an image of a SIMS measurement. This signifies that these hBN epilayers are of high crystalline quality. SIMS measurement results shown in FIG. 17a revealed that hBN epilayers have excellent stoichiometry. FIG. 17b is a low temperature PL spectrum, which exhibits a dominant emission line at ~5.46 eV. An interesting observation is that its emission intensity is about 500 times stronger than the dominant band-edge emission of a high quality AlN epilayer. This strong intensity may be related in part to the high band-edge optical absorption coefficient in hBN (>5×10$^5$ cm$^{-1}$).

Figure 18A:
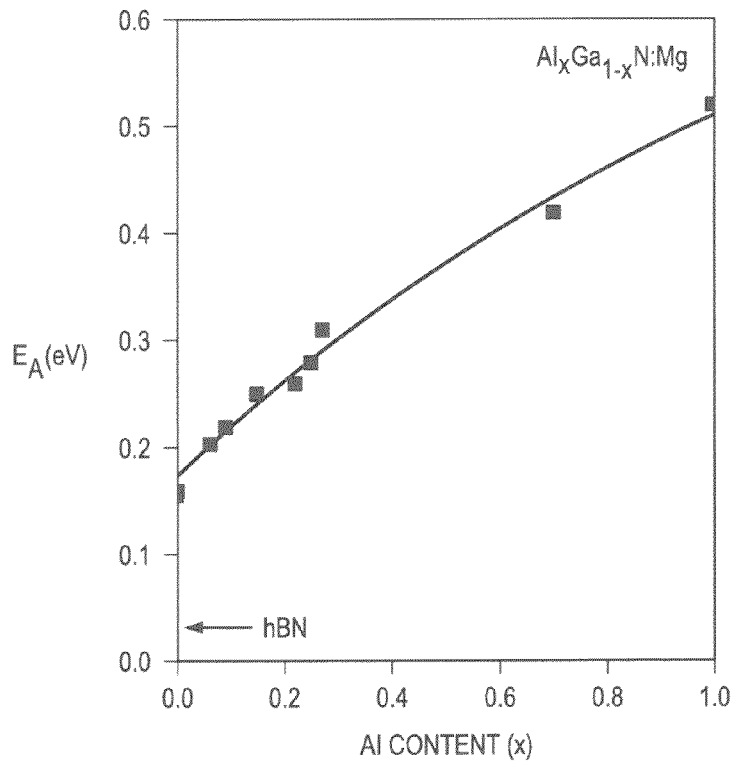
FIG. 18a is a graph of the Mg acceptor level in AlGaN.
Figure 18B:
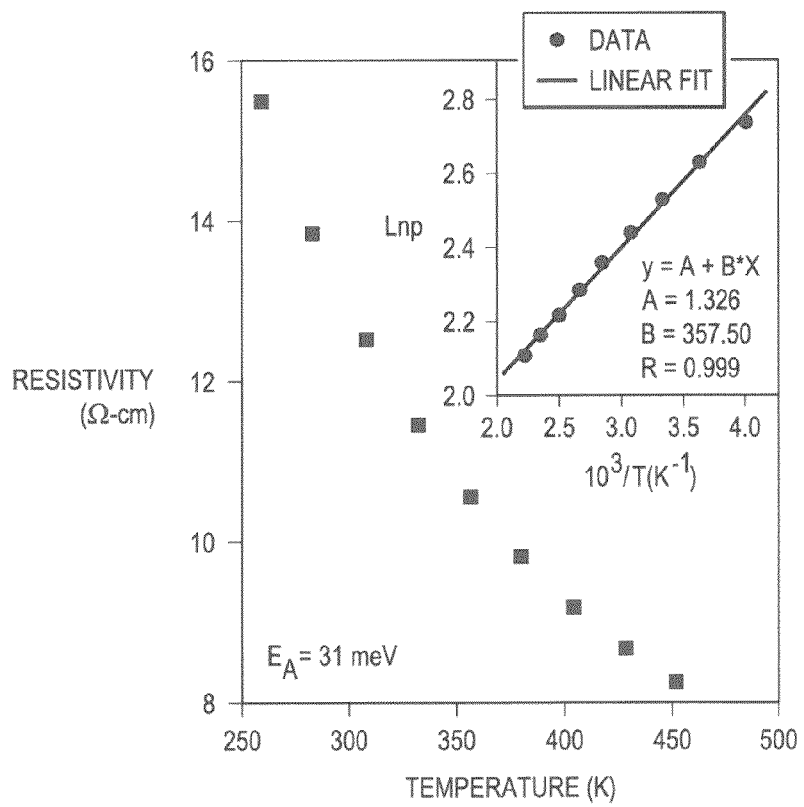
FIG. 18b is a plot of the p-type resistivity as a function of temperature of hBN:Mg.

FIG. 18a is a graph of the Mg acceptor level in AlGaN. FIG. 18b is a plot of the p-type resistivity as a function of temperature of hBN:Mg. AlGaN alloys have been the default choice for the development of DUV optoelectronic devices. Significant progress in nitride material and device technologies has been achieved. However, the most outstanding issue for realizing DUV light emitting diodes (LEDs) and laser diodes with high quantum efficiencies (QEs) is the low conductivity of p-type AlGaN. The resistivity of Mg-doped AlGaN increases with Al-content and becomes extremely high in Mg-doped AlN. The Mg acceptor level ($E_A$) in Al$_x$Ga$_{1-x}$N increases with x, from about 170 meV in GaN (x=0 with Eg~3.4 eV) to 510 meV in AlN (x=1 with Eg~6.1 eV). Since the free hole concentration (p) decreases exponentially with acceptor activation energy, p~exp(−$E_A$/kT), an $E_A$ value around 500 meV in AlN translates to only one free hole for roughly every 2 billion incorporated Mg impurities at room temperature. This leads to extremely resistive p-layers. For instance, an optimized Mg-doped AlN epilayer has a typical "p-type resistivity" of >$10^7$ Ωcm at 300 K. This causes an extremely low free hole injection efficiency into the quantum well active region and is a major obstacle for the realization of AlGaN-based DUV light emitting devices with high QE. Currently, the highest QE of AlGaN-based DUV (wavelength below 280 nm) LED is around 3%. It should be noted that the deepening of the Mg acceptor level in $Al_xGa_{1-x}N$ with increasing x is a fundamental physics problem.

In contrast, as shown in FIG. 18, Mg-doped hBN (hBN:Mg) exhibits a p-type resistivity around 12 Ωcm at 300 K and the estimated $E_A$ value in hBN:Mg is around 31 meV based on the temperature dependent resistivity measurement. This value of $E_A$ is lower than previously determined acceptor levels ranging from 150-300 meV in BN films containing mixed cBN/hBN phases grown by evaporation and sputtering techniques. Hall-effect measurements revealed a free hole concentration p~$1.1\times10^{18}$ cm$^{-3}$ and mobility μ~0.5 cm$^2$/V s. Based on the measured EA value of 31 meV and Mg-doping concentration of $1\times10^{19}$ cm$^{-3}$, the expected fraction of acceptor activation and p value at 300 K would be about 30% and $3\times10^{18}$ cm$^{-3}$, respectively. Thus, the measured and expected p values are in a reasonable agreement. We expect the measured p to be lower than the value estimated from acceptor activation since our hBN:Mg epilayers still possess appreciable concentrations of defects (including free hole compensating centers), as indicated in PL spectrum in FIG. 17. In order to further confirm the conductivity type, we performed Seebeck effect (or hot probe) measurement on hBN:Mg epilayers. Seebeck effect measurement is a well-established technique to distinguish between n-type and p-type conductivity of a semiconductor.

Figure 19A:
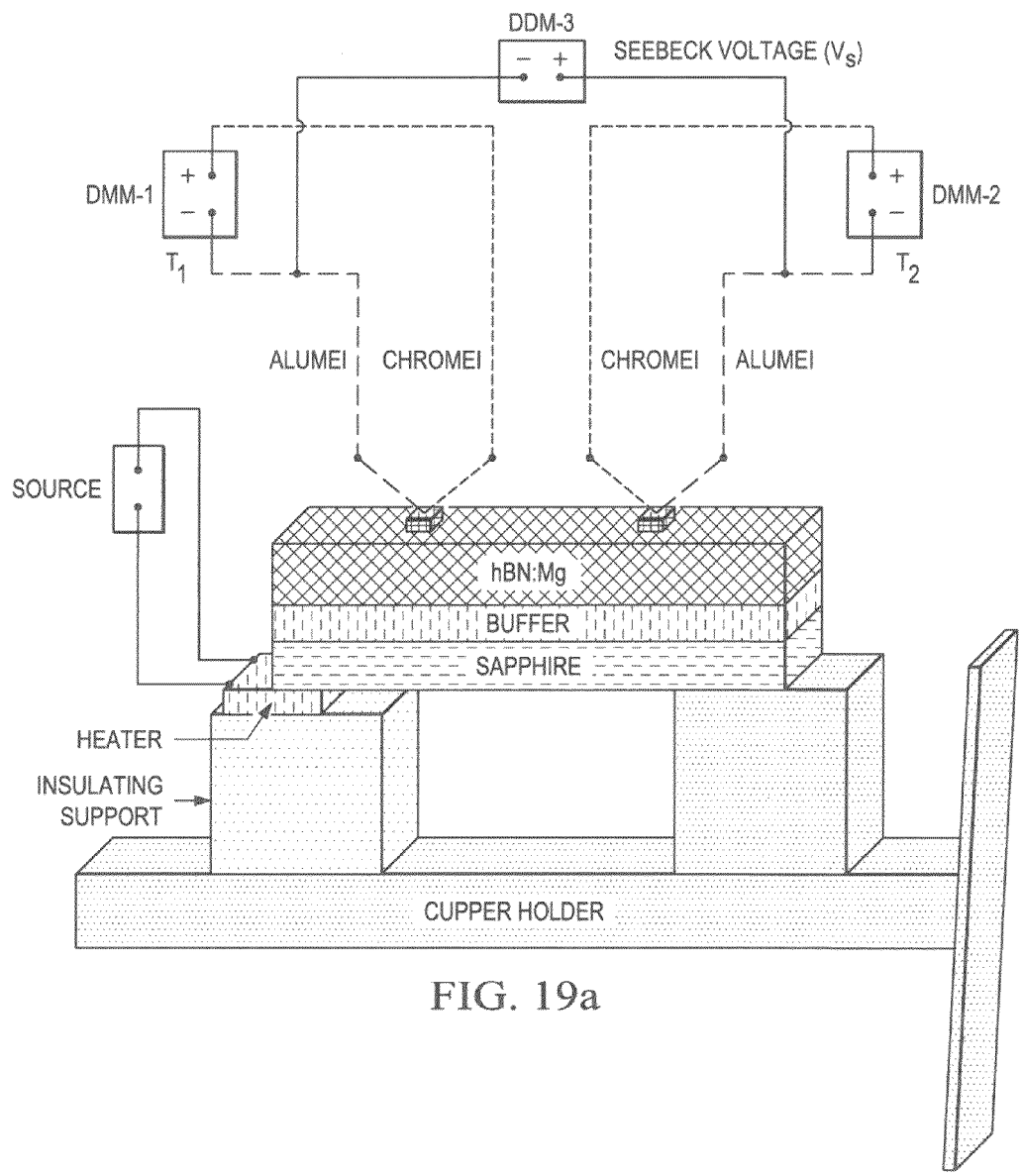
FIG. 19a is an image of a schematic illustration of the setup for the Seebeck effect measurement.
Figure 19B:
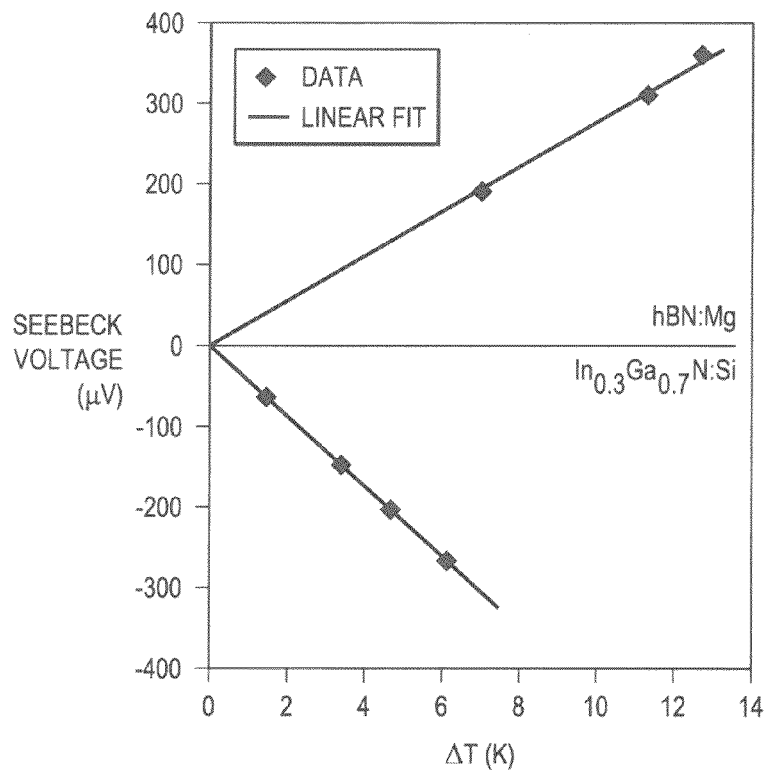
FIG. 19b is a graph of the Seebeck coefficients of Mg-doped hBN.

FIG. 19a is an image of a schematic illustration of the setup for the Seebeck effect measurement. FIG. 19b is a graph of the Seebeck coefficients of Mg-doped hBN. The sample was cut into a rectangular shape (~5×20 mm$^2$). One end of the sample was placed on the sink while a heater was attached on the other end. On the surface of the sample, two thermocouples separated by ~8 mm were attached. In-plane temperature gradient was created along the sample by the heater. The temperature gradient creates a voltage between the cold and hot ends due to the diffusion of thermally excited charged carriers. The direction of this induced potential gradient relative to the direction of the temperature gradient can be utilized to determine if the material is p- or n-type. The Seebeck voltage and temperature gradients were measured for hBN:Mg against a standard n-type In0.3Ga0.7N:Si reference sample and the results are shown in FIG. 19b. The Seebeck coefficient for Si doped In0.3Ga0.7N was S=ΔV/ΔT+SAlumel=−42.2−18.5=−60.7 μV/K while for Mg-doped hBN was S=ΔV/ΔT+SAlumel=28.0−18.5=9.5 μV/K. The sign reversal in S over n-type In0.3Ga0.7N:Si sample confirms unambiguously that hBN:Mg epilayers are p-type. Further work is needed to further improve the overall material quality (and hence hole mobility) and understanding of the mechanisms for defect generation and elimination. Nevertheless, the dramatic reduction in $E_A$ and p-type resistivity (by about six to seven orders of magnitude) of hBN over AlN:Mg represents an exceptional opportunity to revolutionize p-layer approach and overcome the intrinsic problem of p-type doping in Al-rich AlGaN, thus potentially providing significant enhancement to the QE of DUV devices.

Hexagonal boron nitride (hBN) possesses extraordinary physical properties and has emerged as an important material for deep ultraviolet photonics and for the exploration of new physical properties in low dimensional systems similar to graphene. Another potential application of hBN is in the area of solid-state neutron detectors. Neutron detectors with improved detection efficiency are highly sought for a range of applications, including fissile materials sensing, neutron therapy, medical imaging, the study of materials sciences, probing of protein structures, and oil exploration. Currently, the highest efficiency for detecting fissile materials is accomplished using $^3$He. However, not only are $^3$He tube based systems bulky, hard to configure, require high voltage operation, and difficult to transport via air shipment but also there is a significant shortage of $^3$He gas. Thus, there is an urgent need to develop solid-state neutron detectors.

The dominant approach for obtaining a solid-state detector currently is to coat boron containing neutron-to-alpha particle conversion material onto a semiconductor (such as on Si or GaAs) or to construct a boron based semiconductor detector. The working principle is that the boron-10 ($^{10}$B) isotope has a capture cross-section of 3840 b for thermal neutrons (with 0.025 eV energy), which is orders of magnitude larger than those of most isotopes. When a $^{10}$B atom captures a neutron, it undergoes the following nuclear reaction:

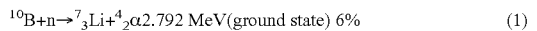

$$^{10}B+n\rightarrow{}^7_3Li+{}^4_2\alpha\ 2.792\text{ MeV(ground state) 6\%} \qquad (1)$$

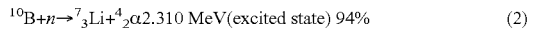

$$^{10}B+n\rightarrow{}^7_3Li+{}^4_2\alpha\ 2.310\text{ MeV(excited state) 94\%} \qquad (2)$$

The efficiency of boron coated conversion devices is inherently low (2-5%) since the two functions (neutron capture and electrical signal generation) occur in separate layers and there are conflicting thickness requirements of the converter layer—The boron (or boron containing) layer must be thick enough (tens of mm) to capture the incoming neutron flux, yet sufficiently thin (a few mm) to allow the daughter particles (α and Li) to reach into the semiconductor layer to generate electrons and holes because the range of α and Li particles from the reaction in B is only around 2-5 mm. While perforated semiconductor neutron detectors exhibited improved detection efficiency, there remain many design and optimization issues. On the other hand, the efficiency of devices based on B4C and pyrolytic boron nitride is still low, ranging from 1% to 7%. Universally, this can be attributed to the following two issues: (a) material's porosity and disordered polycrystalline nature and (b) stringent requirement of large values of carrier diffusion length and lifetime. The boron layer has to be large (tens of mm) in order to capture a majority of the incoming neutron flux as well as to stop all the subsequent charged particles. This implies that the carrier lifetime, or equivalently the carrier diffusion length (LD) has to be very long to enable the spatial separation of the electron-hole pairs before their recombination. Obtaining LD on the order of tens of mm in any type of semiconductors grown by any technique is highly challenging.

The potential of hBN crystals for thermal neutron detection has recently been recognized. It was shown that at similar dimensions, detectors fabricated from hBN microcrystals of natural composition embedded in a polystyrene binder matrix are more efficient than $^3$He gas detectors. Semiconducting hBN neutron detectors have not been previously realized, but are expected to possess all the wonderful attributes of semiconductor detectors as a result of the 50 years of R&D in semiconductor technologies. Here, we report the growth of hBN epilayers and the fabrication of a micro-strip planar metal-semiconductor-metal (MSM) detector to partially relax the requirement of long carrier lifetime and diffusion length for a solid-state neutron detector.

Hexagonal BN epitaxial layers of about 1 mm thickness were synthesized by metal organic chemical vapor deposition (MOCVD) using natural triethylboron (TEB) sources (containing 19.8% of $^{10}$B and 80.2% of $^{11}$B) and ammonia (NH3) as B and N precursors, respectively. Prior to epilayer growth, a 20 nm BN or AlN buffer layer was first deposited on sapphire substrate at 800 1 C. The typical hBN epilayer growth temperature was about 1300 IC. X-ray diffraction (XRD) was employed to determine the lattice constant and crystalline quality of the epilayers. XRD y-2y scan revealed a c-lattice constant ~6.67 A°, which closely matches the bulk c-lattice constant of hBN (c=6.66 A°, affirming that BN films are of a single hexagonal phase.

Figure 20:
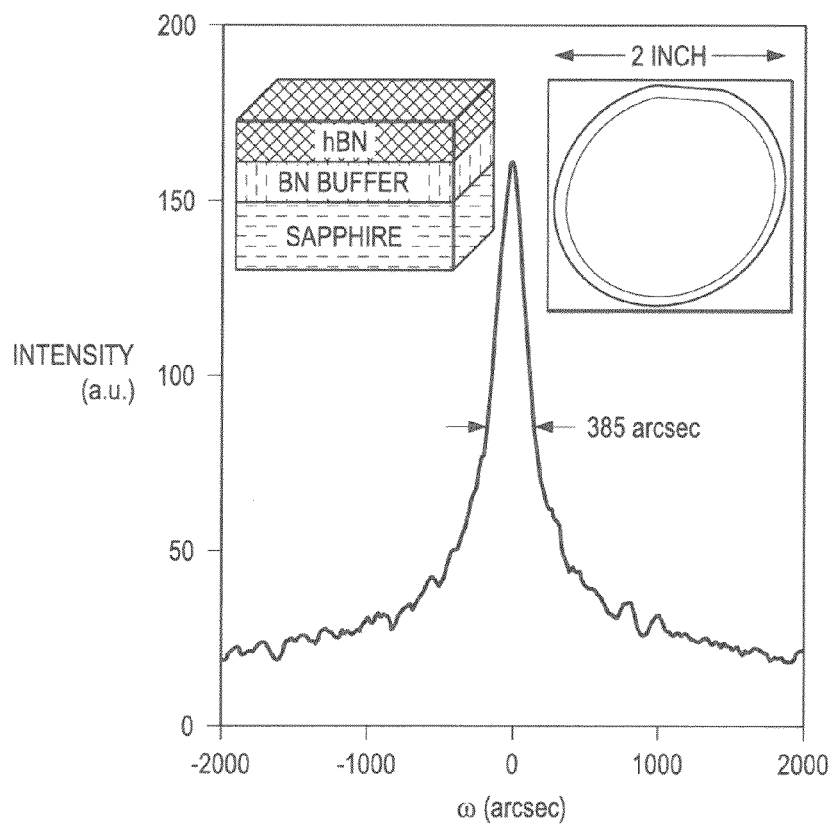
FIG. 20 shows an XRD rocking curve of the reflection of a 1 mm thick hBN film.

FIG. 20 shows an XRD rocking curve of the (0 0 2) reflection of a 1 mm thick hBN film that possesses a full width at half maximum (~385") that is comparable to that of a typical GaN epilayer grown on sapphire with a similar layer thickness, revealing a relatively high crystalline quality of the MOCVD grown hBN epilayers. Secondary ion mass spectrometry (SIMS) measurement (performed by EAG Lab-Evans Analytical Group) revealed that hBN epilayers have excellent stoichiometry. Undoped hBN epilayers typically have an electrical resistivity of ~1013 Ωcm. This makes them highly suited for the fabrication of MSM detectors with extremely low dark current.

Figure 21A:
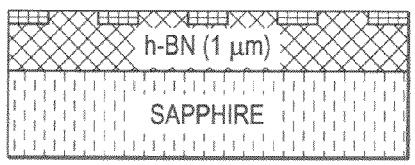
FIG. 21a shows a schematic illustration of the MSM neutron detector.
Figure 21B:
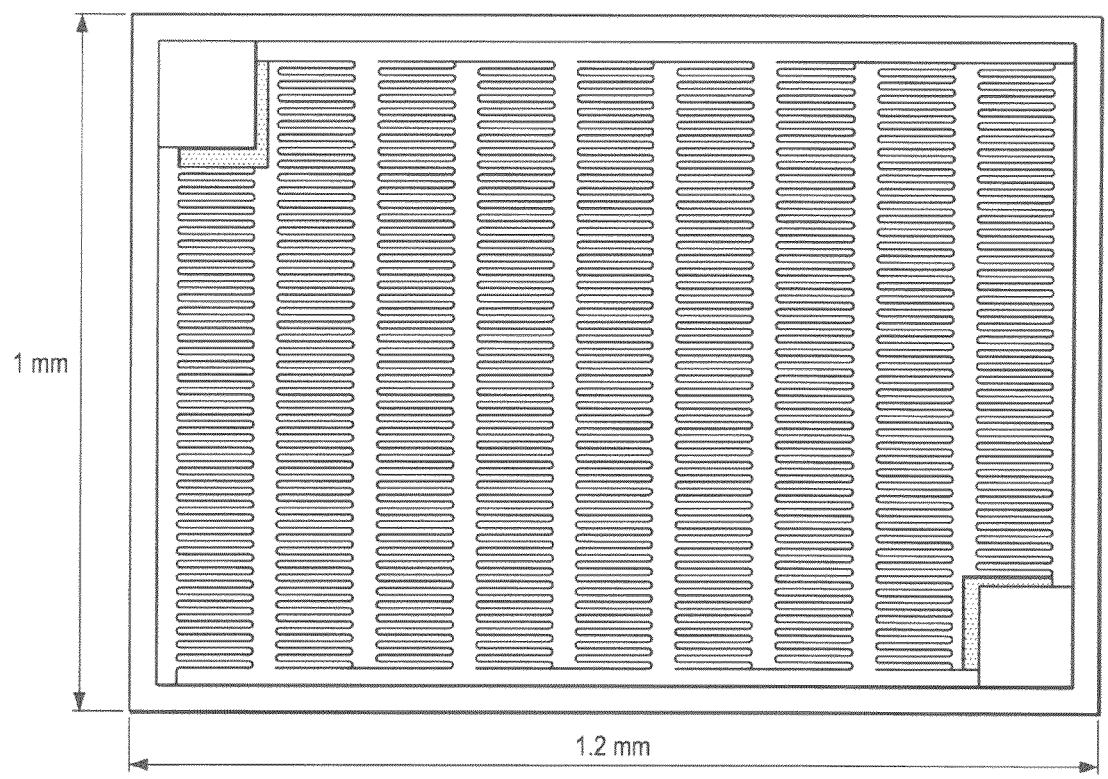
FIG. 21b is a micrograph of a fabricated hBN micro-strip MSM neutron detector.
Figure 21C:
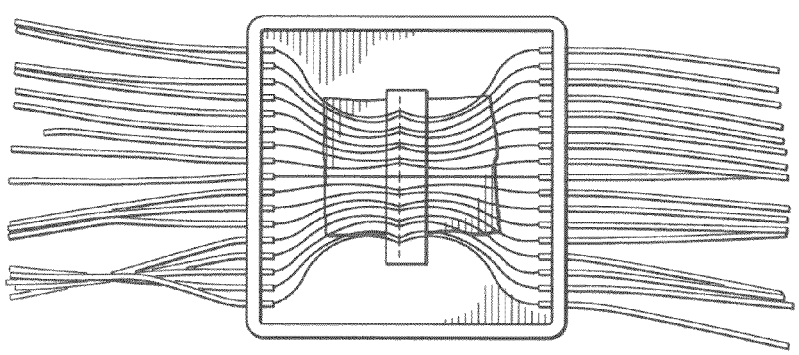
FIG. 21c is a micrograph of a packaged hBN micro-strip MSM neutron detector.

FIG. 21a shows a schematic illustration of the MSM neutron detector. FIG. 21b is a micrograph of a fabricated hBN micro-strip MSM neutron detector. FIG. 21c is a micrograph of a packaged hBN micro-strip MSM neutron detector. The fabrication procedures consisted of the following steps. First, photolithography was employed to define the micro-scale strips (5 mm/5 mm width/spacing) followed by pattern transferring using inductively coupled plasma dry etching to form micro-strips. A bilayer of 5 nm/5 nm (Ni/Au) was deposited using e-beam evaporation to form the Schottky contacts. Bonding pads were then formed by depositing an Au (200 nm) layer. The sapphire substrate was then polished and thinned to about 100 mm and diced to discrete devices, which were bonded onto device holders for characterization. An example of a bonded device is shown in FIG. 2c. Preliminary measurements of interactions between neutrons and hBN materials were carried out at the Kansas State University TRIGA Mark II Reactor. The thermal neutron (0.025 eV) flux was set to about $6.2 \times 10^4/cm^2$ s for the experiment. The system for the steady current response measurements consisted of a source-meter and an electrometer connected in series.

Figure 22:
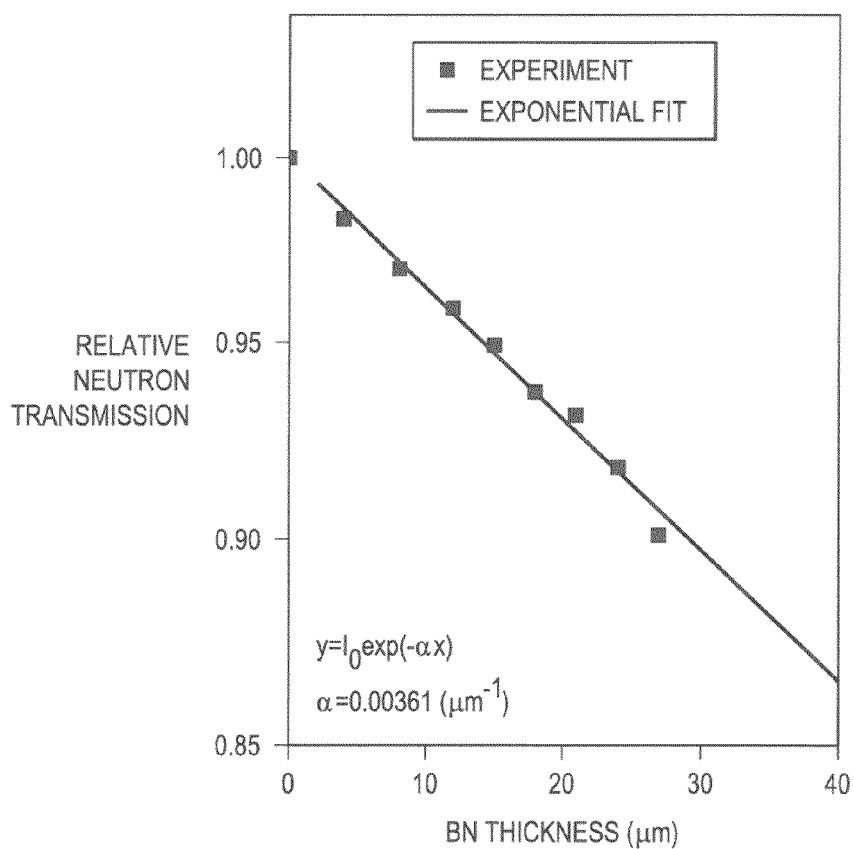
FIG. 22 shows the measured attenuation of normal incidence thermal neutrons in hBN.

FIG. 22 shows the measured attenuation of normal incidence thermal neutrons in hBN. In conducting the measurements, the variation in hBN epilayer thickness was accomplished by adding the number of hBN wafers in the thermal neutron beam path. Fitting experimental data by $I=I_0 e^{-\alpha x}$ yields, respectively, an absorption coefficient (a) and absorption length ($\lambda$) of $$\alpha = 0.00361 \, \mu m^{-1}$$

$$\lambda(=1/\alpha) = 277 \, \mu m.$$

The microscopic thermal neutron absorption length can also be estimated by knowing the thermal neutron capture cross-section $\sigma$ and density of $^{10}B$ in a hexagonal lattice of BN. We have $$\sigma = 3.84 \times 10^3 b = 3.84 \times 10^3 \times 10^{-24} \, cm^2 = 3.84 \times 10^{-21} \, cm^2$$

A hexagonal lattice of BN has lattice constants of a $\alpha$=2.50 A° and c=6.66, which yields, respectively, the density for natural boron N[B] and $^{10}$B isotope N[B-10] as $$N_{[B]} = 5.5 \times 10^{22} \, cm^{-3}$$

$$N_{[B-10]} = 20\% \, N_{[B]} = 1.1 \times 10^{22} \, cm^{-3}.$$

These together yield a theoretical microscopic neutron absorption coefficient($\Sigma$) and absorption length ($\lambda$) in a natural hBN as follows:

$$\Sigma = \sigma N_{[B-10]} = 3.84 \times 10^{-21} \, cm^2 \times 1.1 \times 10^{22} \, cm^{-3}$$

$$= 42 \, cm^{-1} = 4.2 \times 10^{-3} \, \mu m^{-1}$$

$$\lambda = 1/\Sigma = 238 \, \mu m.$$

Thus, the estimated microscopic neutron absorption length is in close agreement with the measured value of 277 mm.

The absolute current response of the detector to continuous irradiation of thermal neutron beam was measured. Although the neutron absorption layer in our devices was only 1 mm, signal generation was evident. This is attributed to the unique planar micro-strip device architecture which not only effectively utilizes the outstanding lateral transport properties of hBN but also alleviates, to a certain degree, the stringent requirement of the large carrier diffusion length needed to ensure a maximum sweep out of electrons and holes at metal contacts.

Figure 23:
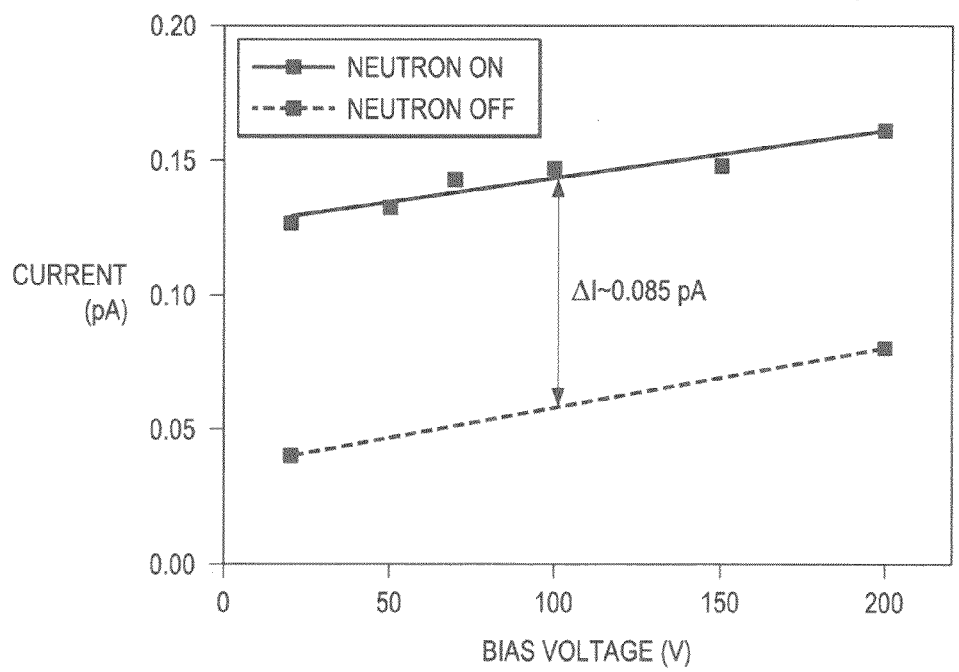
FIG. 23 is a graph of the steady current response in an hBN micro-strip MSM detector fabricated from an epilayer of 1 μm in thickness, subjected to continuous irradiation with thermal neutron beam at a flux of $6.2 \times 10^4/cm^2$ s.

FIG. 23 is a graph of the steady current response in an hBN micro-strip MSM detector (1 mm×1.2 mm) fabricated from an epilayer 1 µm in thickness, subjected to continuous irradiation with thermal neutron (0.025 eV) beam at a flux of $6.2 \times 10^4/cm^2$ s. As illustrated in FIG. 23 it was found that the detectors have low background current and continuous irradiation by the thermal neutron beam at a flux of $6.2 \times 10^4/cm^2$ s generates a steady current response of about 0.085 pA, independent of the applied voltage in the measured range (20-100 V).

We can also estimate the carrier generation rate and magnitude of electrical current signal generated by the continuous irradiation of a thermal neutron beam by considering the dominant nuclear reaction described by Eq. (2). Based on the neutron beam flux (Nflux) used for the experiment, the measured neutron absorption length(l), and device layer thickness (t=1 micron<<the absorption length), the effective absorbed neutron flux (Nflux) by the detector can be calculated and is:

$$N_{flux}^* = (t/\lambda) N_{flux} = (1 \, \mu m/277 \, \mu m) \times 6.2 \times 10^4/cm^2 s$$

$$= 2.2 \times 10^2 / cm^2 s.$$

On the other hand, the energy required to generate one electron-hole ($e^-$-$h^+$) pair is about three times the band gap energy (~18 eV in hBN) [12]. Based on the dominant nuclear reaction described by Eq. (2) each absorbed neutron is expected to generate daughter particles (Li and $\alpha$) with kinetic energies of 2.310 MeV(94%) and 2.792 MeV(6%), giving an average energy of 2.34 MeV, or equivalently $1.3 \times 10^5$ ($e^-$-$h^+$) pairs (=2.34 MeV/18 eV). Therefore, the free electron generation rate(n) would be $$n = N_{flux}^* \times 1.3 \times 10^5, \text{ or}$$

$$n = 2.2 \times 10^2/cm^2 \, s \times 1.3 \times 10^5 = 2.9 \times 10^7/cm^2 \, s.$$

The magnitude of response current (1) can be estimated by knowing the device area (A=1.2 mm2=$1.2 \times 10^{-2}$ cm2) as $$l = 2 \times 2.9 \times 10^7 /cm^2 s \times 1.2 \times 10^{-2} cm^2 (e) =$$

$$7.0 \times 10^5 \times 1.6 \times 10^{-19} (A) \sim 1.1 \times 10^{-13} (A)$$

where the factor of 2 accounts for both the electron and hole conduction. Thus, the expected current of 0.11 pA is in accordance with the experimentally measured result of 0.085 pA. This close agreement between the expected and measured response currents not only provides high confidence in the measurement results, but also implies that the measured performance of the detector is at 77% (¼ 0.085/0.11) of the theoretically predicted.

Since research of semiconducting hBN solid-state neutron detectors is in its very early stage, many issues merit further studies. These include methods to provide discrimination of neutrons from gamma radiation; conducting the neutron detection experiments in vacuum to further confirm the device indeed detects the neutrons as a semiconductor; and increased neutron absorption via increased epilayer thickness. An effective way to gain neutron detection efficiency is by $^{10}$B isotopic enrichment of the source molecule, which can increase the neutron capture efficiency with little impact on the semiconducting properties. The use of a $^{10}$B enriched (100% $^{10}$B) TEB source for B precursor will reduce the epilayer thickness requirement by a factor of 5.

This means that 200 mm thick $^{10}$B enriched hBN epilayer can captures 98.5% of neutrons instead of 1 mm thickness required for natural hBN. However, with the existing semiconductor detector technology developed in the last 50 years, hBN based semiconductor neutron detectors have the potential to revolutionize neutron detection. With BN neutron capture, charge collection, and electrical signal generation occurring in a single material, the signal loss that is inherent in current existing solid-state detectors can be eliminated. With further developments in material growth and device design such as incorporating thick $^{10}$B enriched epilayers (or multiple $^{10}$B enriched epilayers) with improved crystalline quality and device architectures to effectively utilize lateral transport in hBN, in principle, the neutron detection efficiency of hBN semiconductor detectors can approach 100%. Furthermore, the ability of producing wafer scale hBN semiconducting materials by techniques such as MOCVD also opens the possibility to construct relative large area detectors as well as two-dimensional array neutron cameras.

It is contemplated that any embodiment discussed in this specification can be implemented with respect to any method, kit, reagent, or composition of the invention, and vice versa. Furthermore, compositions of the invention can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, MB, BBC, AAABCCCC, CBBAAA, CABABB, and so forth. The skilled artisan will understand that typically there is no limit on the number of items or terms in any combination, unless otherwise apparent from the context.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

REFERENCES

1. Carrano, John et al., "Ultraviolet Light," SPIE's oe magazine, p. 20 Jun. 2003.
2. Shatalov, Max et al., "Large Chip High Power Deep Ultraviolet Light-Emitting Diodes," Appl. Phys. Express 3 062101 (2010).
3. Nakarmi, M. L. et al., "Transport Properties of Conductive N Type Al Rich AlxGa1.xN (x~0.7)," Appl. Phys. Lett., 85, 3769 (2004).
4. Zhu, K. et al., "Silicon Doping Dependence of Dighly Donductive n-type Alo.lGao3N," Appl. Phys. Lett. 85, 4669 (2004).
5. Nakarmi, M. L. et al., "Electrical and Optical Properties of Mg-doped A10.7Gao3N Alloys," Appl. Phys. Lett. 86, 092108 (2005).
6. Khizar, M. et al., "Nitride Deep Ultraviolet Lightemitting Diodes with Microlens Array," Appl. Phys. Lett. 86, 173504 (2005).
7. AsifKhan, M. et al., "Ultraviolet Light Emitting Devices and Methods of Fabrication," U.S. Patent Application Publication No. 2010/0032647 A1.

8. Fujioka, A. et al., "Improvement in Output Power of 280 nm Deep Ultraviolet Light Emitting Diode by Using AlGaN Multi Quantum Wells," Appl. Phys. Exp. 3, 041001 (2010).

9. Pernot, C. et al., "Improved Efficiency of 255 280 nmAlGaN Based Light Emitting Diodes," Appl. Phys. Express 3 061004 (2010).

10. Hirayama, H. et al., "Marked Enhancement in the Efficiency of Deep Ultraviolet AlGaN Light Emitting Diodes by Using a Multiquantum Barrier Electron Blocking Layer," Appl. Phys. Express 3 031002 (2010).

11. Fan, Z. Y. et al., "Achieving Conductive High Al Content AlGaN Alloys for Deep UV Photonics," Proceeding of SPIE 6479, 647911 (2007).

12. Nam, K. B. et al., "Mg Acceptor Level in AlN Probed by Deep Ultraviolet Photoluminescence," Appl. Phys. Lett 83, 878 (2003).

13. Nakarmi, M. L. et al., "Correlation Between Optical and Electrical Properties of Mg Doped AlN Epilayers," Appl. Phys. Lett. 89, 152 120 (2006).

14. Nepal, N. et al, "Growth and Photoluminescence Studies of Zn Doped AlN Epilayers," Appl. Phys. Lett. 89, 192, 111 (2006).

15. Wantanabe, K. et al., "Direct Bandgap Properties and Evidence for Ultraviolet Lasing of Hexagonal Boron Nitride Single Crystal," Nature Mater. 3 404 (2004).

16. Mirkarmi, P. B. et al., "Review of Advances in Cubic Boron Nitride Film Synthesis," Mater. Sci. Eng. Rep.

17. Lu, Ming et al. "Electrical Properties of Boron Nitride Thin Films Grown by Neutralized Nitrogen Ion Assisted Vapor Deposition," Appl. Phys. Lett. 68, 622 (1996).

18. Nose, K. et al., "Electric Conductivity of Boron Nitride Thin Films Enhanced by in situ Doping of Zinc," Appl. Phys. Lett. 89, 11, 2124 (2006).

19. He, B. et al., "P-Type Conduction in Berylliumimplanted Hexagonal Boron Nitride Films," Appl. Phys. Lett. 95 252-106 (2009).

20. Kouzes, R. L., The $^3$He Supply Problem, April 2009; Pacific Northwest National Laboratory; Prepared for the U.S. Department of Energy under Contract DE AC50 76RL01830; http://www.pnl.gov/main/publications/external/technical reports/PNN L1.83,88.pdf.

21. Knoll, G. F., Radiation Detection and Measurement, 3rd ed (J. Wiley, 2000); N. Tsoulfanidis, Measurement and Detection of Radiation, pp. 131-137, Taylor & Francis, Washington, 1995.

22. Osberghaus, "Isotopic abundance of boron. Mass spectrometric investigation of the electronimpact products of boron trifluoride and boron trichloride," Zeitschrift fuer Physik 128 366 77 (1950).

23. Nikolic, R. J. et al., "Future of semiconductor based thermal neutron detectors," UCRL PROC 219274, Nanotech 2006, Boston.

24. Rose, A. "Sputtered boron films on silicon surface barrier detectors," Nucl. Inst. Meth. 52 166 (1967).

25. Gersch, H. K. et al., "The effect of incremental gamma ray doses and incremental fluences upon the performance of self biased$_{10B}$ coated high purity epitaxial GaAs thermal neutron detectors," Nucl. Inst. Meth. Phys. Res. A 489 (2002).

26. LiCausi, N. et al., "A novel solid state self powered neutron detector," Proc. SPIE 7079 707908 (2008).

27. Nikolic, R. J. et al., "6:1 aspect ratio silicon pillar based thermal neutron detector filled with 108," Appl. Phys. Lett. 93 133502 (2008).

28. Nikolic, R. J. et al., "Roadmap for High Efficiency Solid State Neutron Detectors," Proc. SPIE, 6013 601305 (2005).

29. Conway, A. M. et al., "Numerical simulations of pillar structured solid state thermal neutron detector: efficiency and gamma discrimination," IEEE Trans. Nucl. Sci, 56 2802 (2009).

30. Uher, J. et al., "Efficiency of composite boron nitride neutron detectors in comparison with helium 3 detectors," Appl. Phys. Lett. 90, 124101 (2007).

31. Kurtz, Sarah et al., "Multijunction solar cells for conversion of concentrated sunlight to electricity," Energy Express 18, A73 (2010).

What is claimed is:

1. A hexagonal boron nitride semiconductor detector comprising:
    a substrate wherein the substrate comprises sapphire, SiC, Si, Graphite, highly oriented pristine graphite (HOPG), GaN, AlN, BN, or a combination thereof; and
    one or more hexagonal boron nitride epilayers coated on the substrate, wherein the one or more hexagonal boron nitride epilayers comprise $B_{1-z}Ga_zN$ alloys; $B_{1-x}Al_xN$, $B_{1-x-y}Al_xGa_yN$ alloys, $B_{1-x-y}N_xC_y$ alloys, wherein $0 \le x \le 1$, $0 \le y \le 1$, and $0 < z \le 1$.

2. The device of claim 1, wherein the one or more hexagonal boron nitride epilayers comprise enriched $^{10}B$.

3. The device of claim 1, further comprising alternating AlN and hexagonal boron nitride epilayers.

4. The device of claim 1, wherein the one or more hexagonal boron nitride epilayers have a thickness of greater than about 50 μm.

5. The device of claim 1, wherein the hexagonal boron nitride semiconductor comprises a heterostructure selected from $BN/B_{1-x}Ga_xN$ heterostructures; $BN/B_{1-x}Al_xN$ heterostructures; $BN/B_{1-x-y}Al_xGa_yN$ heterostructures; $BN/(BN)_{1-x}C_x$ heterostructures; or $BN/B_{1-x-y}N_xC_y$ heterostructures; or $InAlGaN/B_{1-x-y}N_xC_y$, wherein $0 \le x \le 1$, $0 \le y \le 1$, and $0 \le z \le 1$.

6. The device of claim 5, wherein the heterostructure comprise enriched $^{10}B$.

7. The device of claim 1, wherein the one or more hexagonal boron nitride epilayers are individually doped with one or more p-type dopants selected from Si, Mg, C, Zn, Be; one or more n-type dopants selected from Si, O, S, Se; or both.

8. The device of claim 1, further comprising one or more quantum wells selected from $BN/B_{1-x}Ga_xN/BN$, $B_{1-y}Ga_yN/B_{1-x}Ga_xN/B_{1-z}Ga_zN$ QWs; $BN/B_{1-x}Al_xN/BN$, $B_{1-y}Al_yN/B_{1-x}Al_xN/B_{1-z}Al_zN$ QWs; $BN/B_{1-x-y}Al_xGa_yN/BN$ QWs; $BN/(BN)_{1-x}C_x/BN$ QWs; $InAlGaN/BCN/InAlGaN$ QWs; and $BN/B_{1-x-y}N_xC_y/BN$ QWs, wherein $0 \le x \le 1$, $\le y \le 1$, and $0 < z \le 1$.

9. The device of claim 1, further comprising a buffer layer between the substrate and the one or more hexagonal boron nitride epilayers; between two of the one or more hexagonal boron nitride epilayers or both.

10. The device of claim 1, further comprising one or more buffer layers selected from a BN, BCN buffer, a MN buffer, a GaN buffer, a AlInGaN buffer, a AlGaN buffer, a BAlN buffer, a BGaN buffer, a BAlGaN buffer or a combination thereof.

11. The device of claim 1, further comprising one or more contacts comprising Au, Al, Ni, Pd, Pt, and alloys thereof.

12. The device of claim 1, wherein the hexagonal boron nitride semiconductor device is a Neutron detector, a Metal-semiconductor-metal detector, a Schottky detector, a p-i-n detector, a Lateral conducting detector, a stacked layer detector.

13. The device of claim 1, wherein the hexagonal boron nitride semiconductor device is a light emitting or detecting device comprising a BN p-i-n structure, a n-BN/(BN)C/p-BN emitter or detector, a n-BNC/BCN/p-BCN emitter or detector, a n-BN/AlBN/p-BN emitter or detector, a n-BN/GaBN/p-BN emitter, or detector, a-InAlGaN/BNC/p-InAlGaN emitter or detector, or a n-BN/AlGaBN/p-BN emitter or detector.

14. The device of claim 1, wherein the one or more hexagonal boron nitride epilayers comprise $B_{1-x-y}N_xC_y$ alloys wherein $0 \leq x \leq 1$, and $0 \leq y \leq 1$.

* * * * *